US011784076B2

(12) United States Patent
Ishii et al.

(10) Patent No.: US 11,784,076 B2
(45) Date of Patent: Oct. 10, 2023

(54) SUBSTRATE TRANSFER MECHANISM TO REDUCE BACK-SIDE SUBSTRATE CONTACT

(71) Applicant: Applied Materials, Inc., Santa Clara, CA (US)

(72) Inventors: Masato Ishii, Sunnyvale, CA (US); Richard O. Collins, Santa Clara, CA (US); Richard Giljum, Brentwood, CA (US); Alexander Berger, Palo Alto, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 17/866,152

(22) Filed: Jul. 15, 2022

(65) Prior Publication Data

US 2022/0351999 A1 Nov. 3, 2022

Related U.S. Application Data

(62) Division of application No. 16/899,043, filed on Jun. 11, 2020, now Pat. No. 11,424,149, which is a (Continued)

(51) Int. Cl.
*H01L 21/687* (2006.01)
*H01L 21/677* (2006.01)
(Continued)

(52) U.S. Cl.
CPC .. *H01L 21/67778* (2013.01); *H01L 21/67017* (2013.01); *H01L 21/67109* (2013.01);
(Continued)

(58) Field of Classification Search
CPC ................................................ H01L 21/68742
See application file for complete search history.

(56) References Cited

U.S. PATENT DOCUMENTS 6,148,762 A * 11/2000 Fukuda ............. H01L 21/68742
118/715
6,558,509 B2 5/2003 Kraus et al.
(Continued)

FOREIGN PATENT DOCUMENTS

JP 2000357724 A 12/2000
JP 2003197709 A 7/2003
(Continued)

OTHER PUBLICATIONS

Taiwan Office Action dated Oct. 11, 2022 for Application No. 108102630.
(Continued)

*Primary Examiner* — Binu Thomas
(74) *Attorney, Agent, or Firm* — PATTERSON + SHERIDAN, LLP

(57) ABSTRACT

A substrate processing system is disclosed which includes a processing chamber comprising a susceptor having a first surface and a second surface opposite to the first surface, a groove formed in the first surface adjacent to a perimeter thereof, and a substrate support structure including a plurality of carrier lift pins, each of the plurality of carrier lift pins movably disposed in an opening formed from the second surface to the first surface, wherein the opening is recessed from the groove.

24 Claims, 24 Drawing Sheets

Related U.S. Application Data division of application No. 15/894,735, filed on Feb. 12, 2018, now Pat. No. 10,755,955.

(51) Int. Cl.
*H01L 21/673* (2006.01)
*H01L 21/67* (2006.01)
*H01L 21/68* (2006.01)

(52) U.S. Cl.
CPC .. *H01L 21/67115* (2013.01); *H01L 21/67126* (2013.01); *H01L 21/67196* (2013.01); *H01L 21/67201* (2013.01); *H01L 21/67207* (2013.01); *H01L 21/67248* (2013.01); *H01L 21/67346* (2013.01); *H01L 21/67739* (2013.01); *H01L 21/67748* (2013.01); *H01L 21/67751* (2013.01); *H01L 21/68* (2013.01); *H01L 21/68707* (2013.01); *H01L 21/68735* (2013.01); *H01L 21/68742* (2013.01); *H01L 21/68757* (2013.01)

(56) References Cited

U.S. PATENT DOCUMENTS

| | | | | |
|---|---|---|---|---|
| 8,672,605 | B2 | 3/2014 | van der Meulen et al. | |
| 9,735,002 | B2 | 8/2017 | Kawaguchi et al. | |
| 2006/0156981 | A1* | 7/2006 | Fondurulia | H01L 21/68785 118/715 |
| 2007/0196011 | A1 | 8/2007 | Cox et al. | |
| 2009/0014324 | A1 | 1/2009 | Kawaguchi et al. | |
| 2010/0075488 | A1* | 3/2010 | Collins | H01L 21/68742 118/719 |
| 2011/0033620 | A1* | 2/2011 | Polyak | H01L 21/68742 118/500 |
| 2011/0114014 | A1 | 5/2011 | Sakurai et al. | |
| 2012/0148760 | A1 | 6/2012 | Egami et al. | |
| 2012/0227666 | A1 | 9/2012 | Kim | |
| 2012/0247671 | A1 | 10/2012 | Sugawara | |
| 2014/0265091 | A1 | 9/2014 | Sheelavant et al. | |
| 2014/0271054 | A1 | 9/2014 | Weaver et al. | |
| 2016/0314997 | A1 | 10/2016 | Reuter et al. | |
| 2017/0110352 | A1 | 4/2017 | Tobin | |
| 2017/0133260 | A1* | 5/2017 | Pohl | H01L 21/68742 |
| 2017/0162409 | A1 | 6/2017 | Toyomura et al. | |
| 2018/0019145 | A1 | 1/2018 | Sugawara | |
| 2018/0090363 | A1* | 3/2018 | Breninger | H01L 21/68742 |
| 2019/0214290 | A1* | 7/2019 | Marcelynas | H01L 21/68742 |

FOREIGN PATENT DOCUMENTS

| | | | |
|---|---|---|---|
| JP | 2012199402 | A | 10/2012 |
| KR | 100749755 | B1 | 8/2007 |
| KR | 20120117272 | A | 10/2012 |
| KR | 20150130261 | A | 11/2015 |
| WO | 2008076733 | A1 | 6/2008 |
| WO | 2017066418 | A1 | 4/2017 |
| WO | 2017093102 | A1 | 6/2017 |

OTHER PUBLICATIONS

International Search Report and Written Opinion for Application No. PCT/US2019/014033 dated May 8, 2019.
Supplementary European Search Report for Application No. EP 19 75 1343 dated Oct. 1, 2021.
Japanese Office Action for Application No. 2020-542451 dated Nov. 30, 2021.
Korean Office Action for Application No. 10-2020-7026282 dated Dec. 13, 2021.
Japanese Decision to Grant Patent dated Apr. 12, 2022 for Application No. 2020-542451.
Korean Office Action for Application No. 10-2022-7025646 dated Mar. 16, 2023.

* cited by examiner

SUBSTRATE TRANSFER MECHANISM TO REDUCE BACK-SIDE SUBSTRATE CONTACT

CROSS-REFERENCE TO RELATED APPLICATIONS

This application is a divisional of U.S. patent application Ser. No. 16/899,043, filed Jun. 11, 2020, which is a divisional of U.S. patent application Ser. No. 15/894,735, filed Feb. 12, 2018, both of which are hereby incorporated by reference in their entireties.

BACKGROUND

Field

The present disclosure generally relates to a method and apparatus for transferring substrates in a processing tool. More specifically, the present disclosure relates to a method and apparatus for transferring substrates in a chamber or multiple chambers of the processing tool.

Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device.

Many conventional thermal processes are commonly used in the fabrication of transistors and other electronic devices. These processes are typically performed in a tool having multiple chambers, such as a cluster tool. Particle generation and/or damage to a substrate is of utmost concern during these processes in order to achieve a desired yield. However, one source of particles and/or damage occurs during substrate transfer, i.e., when the substrate is moved within a particular process chamber on the tool, or when a substrate is moved from one chamber of the tool to another chamber of the tool.

It has been determined that conventional substrate lift pins, which contact a backside, i.e., a side opposing a deposit receiving side, of a substrate during transfer, are one cause of particles and/or substrate damage. For example, the contact of the substrate with lift pins may scratch the substrate and/or cause particles from the contact. The particles from contact may contaminate the chamber, the substrate, or subsequent substrates, all of which reduces yield.

Therefore, there is a need for an improved method and apparatus for transferring a substrate in a tool.

SUMMARY

The present disclosure generally relates to a method and apparatus for transferring substrates in a processing tool. More specifically, the present disclosure relates to a method and apparatus for transferring substrates in a chamber or multiple chambers of the processing tool.

In one embodiment, A substrate processing system is disclosed which includes a substrate input/output chamber coupled to a transfer chamber, and one or more processing chambers coupled to the transfer chamber, wherein the substrate input/output chamber includes a plurality of stacked carrier holders, and one of the carrier holders includes a substrate carrier to support a substrate thereon.

In another embodiment, a load lock chamber is disclosed which includes a platen having a heat transfer element embedded therein, a plurality of carrier holders positioned about the platen, and a plurality of support members extending from each of the stacked carrier holders, and a carrier positioned on the support members of one of the plurality of stacked carrier holders.

In another embodiment, a processing chamber is disclosed that includes a susceptor having a groove formed therein adjacent to a perimeter thereof, and a substrate support structure including a plurality of carrier lift pins, wherein each of the carrier lift pins is received in an opening adjacent to the groove.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides a method and apparatus transferring substrates in a processing tool. In particular, transferring a substrate using a substrate transferring mechanism that minimizes contact with major surfaces of the substrate.

Figure 1:
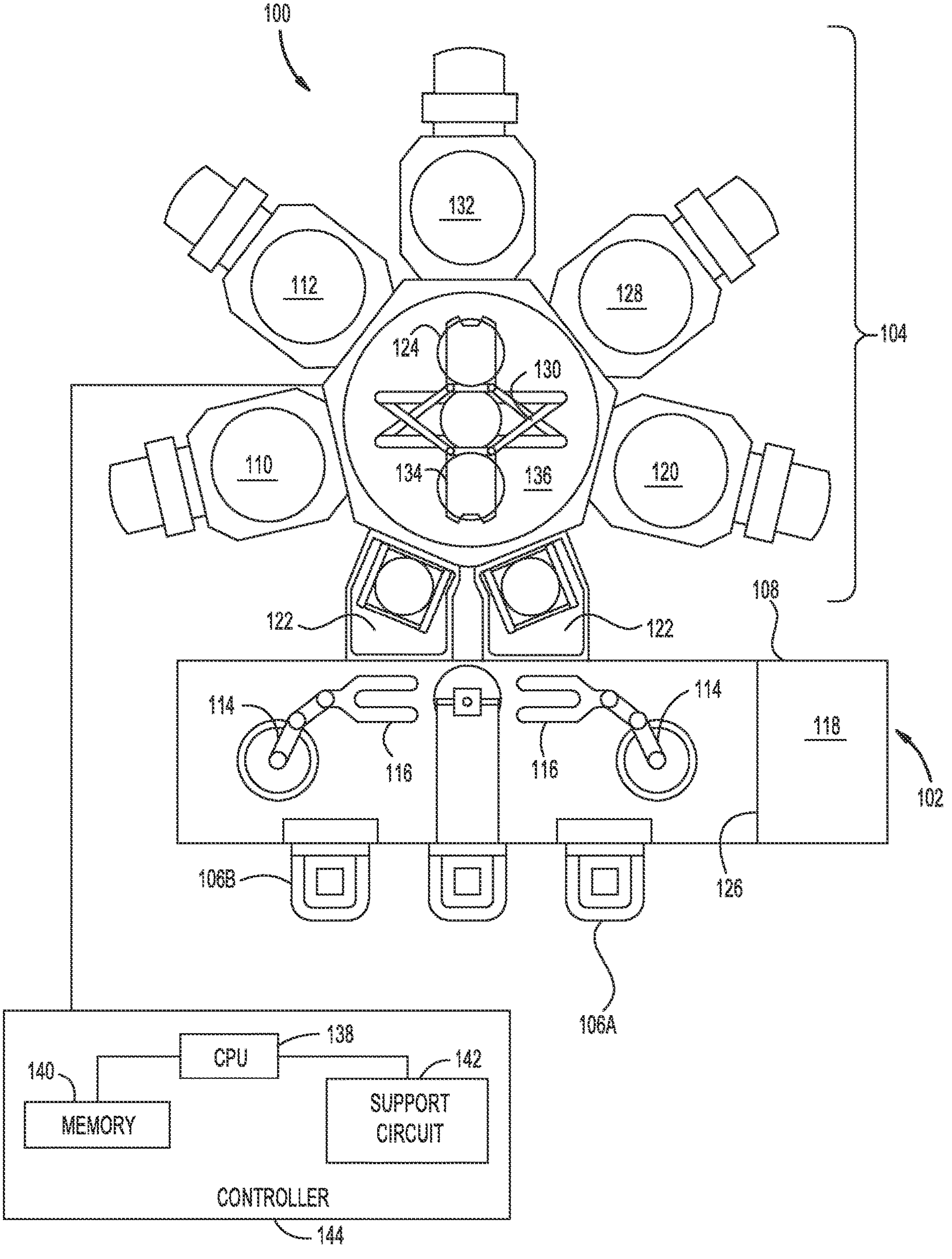
FIG. 1 depicts a schematic diagram of an exemplary processing apparatus suitable for practice the present disclosure.

FIG. 1 is a schematic, top plan view of an exemplary processing system 100 that includes one embodiment of a substrate transfer mechanism suitable for practicing the present disclosure. The processing system 100 includes a substrate input/output chamber 122 a vacuum-tight processing platform 104, a factory interface 102, and a system controller 144. The substrate input/output chamber 122 may be a load lock chamber. In one embodiment, the processing system 100 may be a CENTURA® integrated processing system, commercially available from Applied Materials, Inc., located in Santa Clara, Calif. It is contemplated that other processing systems (including those from other manufacturers) may be adapted to benefit from the disclosure.

The platform 104 includes a plurality of processing chambers 110, 112, 132, 128, 120 and at least one substrate input/output chamber 122 that are coupled to a vacuum substrate transfer chamber 136. Two substrate input/output chambers 122 are shown in FIG. 1. The factory interface 102 is coupled to the transfer chamber 136 by the substrate input/output chambers 122.

In one embodiment, the factory interface 102 comprises at least one docking station 108 and at least one factory interface robot 114 to facilitate transfer of substrates. The docking station 108 is configured to accept one or more front opening unified pod (FOUP). Two FOUPS 106A, 10666 are shown in the embodiment of FIG. 1. The factory interface robot 114 having a blade 116 disposed on one end of the robot 114 is configured to transfer the substrate from the FOUPS 106A, 10666 to the processing platform 104 for processing through the substrate input/output chambers 122.

Each of the substrate input/output chambers 122 has a first port coupled to the factory interface 102 and a second port coupled to the transfer chamber 136. The substrate input/output chambers 122 are coupled to a pressure control system (not shown) which pumps down and vents the substrate input/output chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 has a blade 134 capable of transferring substrates 124 between the substrate input/output chambers 122 and the processing chambers 110, 112, 132, 128, 120.

The system controller 144 is coupled to the processing system 100. The system controller 144 controls the operation of the system 100 using a direct control of the process chambers 110, 112, 132, 128, 120 of the system 100 or alternatively, by controlling the computers (or controllers) associated with the process chambers 110, 112, 132, 128, 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines, when executed by the CPU 138, transform the CPU 138 into a specific purpose computer (controller) 144. The software routines may also be stored and/or executed by a second controller (not shown) that is located remotely from the system 100.

Figure 2:
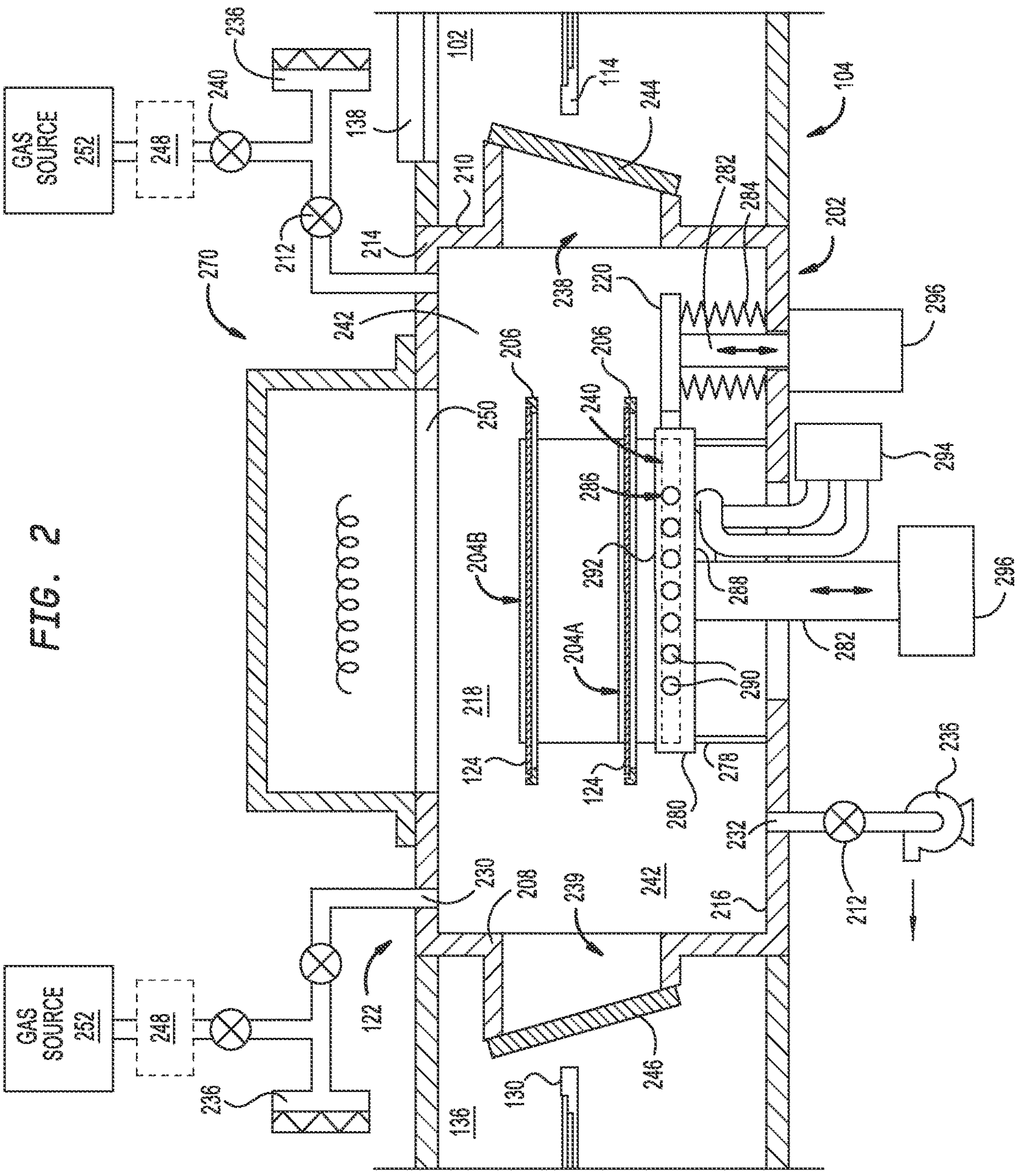
FIG. 2 is a cross-sectional view of the load lock chamber according to one embodiment of the disclosure.

FIG. 2 is a cross-sectional view of the substrate input/output chamber 122 according to one embodiment of the disclosure. The substrate input/output chamber 122 generally comprises a chamber body 202, a first carrier holder 204B, a second carrier holder 204A, a temperature control pedestal 240 and an optional heater module 270. Each of the first carrier holder 204B and the second carrier holder 204A include a substrate 124 supported by a carrier 206. The chamber body 202 may be fabricated from a singular body of material such as aluminum. The chamber body 202 includes a first side wall 208, a second side wall 210, lateral walls 242 (only one is shown in FIG. 2), a top 214 and a bottom 216 that define a chamber volume 218. Windows (not shown) may be provided in the top 214 of the chamber body and are typically comprised of quartz. When a heater module 270 is included, the top 214 of the chamber body 202 is at least partially covered by the heater module 270.

The pressure of the chamber volume 218 may be controlled so that the substrate input/output chamber 122 may be evacuated to substantially match the environment of the transfer chamber 136 and be vented to substantially match the environment of the factory interface 102. The chamber body 202 includes one or more vent passages 230 and a pump passage 232. The flow within the substrate input/output chamber 122 during venting and evacuation is substantially laminar due to the position of the vent passage 230 and pump passage 232 and is configured to minimize particulate contamination.

The pump passage 232 is coupled to the vacuum pump 236. The vacuum pump 236 has low vibration to minimize the disturbance of the substrate 124 positioned on the holders 204B, 204A within the substrate input/output chamber 122 while promoting pump-down efficiency and time by minimizing the fluid path between the substrate input/output chamber 122 and pump 236 to generally less than three feet.

A first loading port 238 is disposed in the first side wall 208 of the chamber body 202 to allow the substrate 124 to be transferred between the substrate input/output chamber 122 and the factory interface 102. A first slit valve 244 selectively seals the first loading port 238 to isolate the substrate input/output chamber 122 from the factory interface 102. A second loading port 239 is disposed in the second side wall 210 of the chamber body 202 to allow the substrate 124 to be transferred between the substrate input/output chamber 122 and the transfer chamber 136. A second slit valve 246 which is substantially similar to the first slit valve 244 selectively seals the second loading port 239 to isolate the substrate input/output chamber 122 from the vacuum environment of the transfer chamber 136.

The first carrier holder 204B is concentrically coupled to (i.e., stacked on top of) the second carrier holder 204A that is disposed above the chamber bottom 216. The carrier holders 204B, 204A are generally mounted to a support 220 that is coupled to a shaft 282 that extends through the bottom 216 of the chamber body 202. Typically, each carrier holder 204B, 204A is configured to retain one substrate positioned on a respective carrier 206. The shaft 282 is coupled to a lift mechanism 296 disposed exterior to the substrate input/output chamber 122 that controls the elevation of the carrier holders 204B and 204A within the chamber body 202. A bellows 284 is coupled between the support 220 and the bottom 216 of the chamber body 202 and disposed around the shaft 282 to provide a flexible seal between the second carrier holder 204A and the bottom 216, thus preventing leakage from or into the chamber body 202 and facilitating raising and lowing of the carrier holders 204B, 204A without compromising the pressure within the substrate input/output chamber 122.

The first carrier holder 204B is utilized to hold an unprocessed substrate from the factory interface 102 on a first carrier 206 while the second carrier holder 204A is utilized to hold a processed substrate (e.g., an etched substrate) on a second carrier 206 returning from the transfer chamber 136.

Figure 3A:
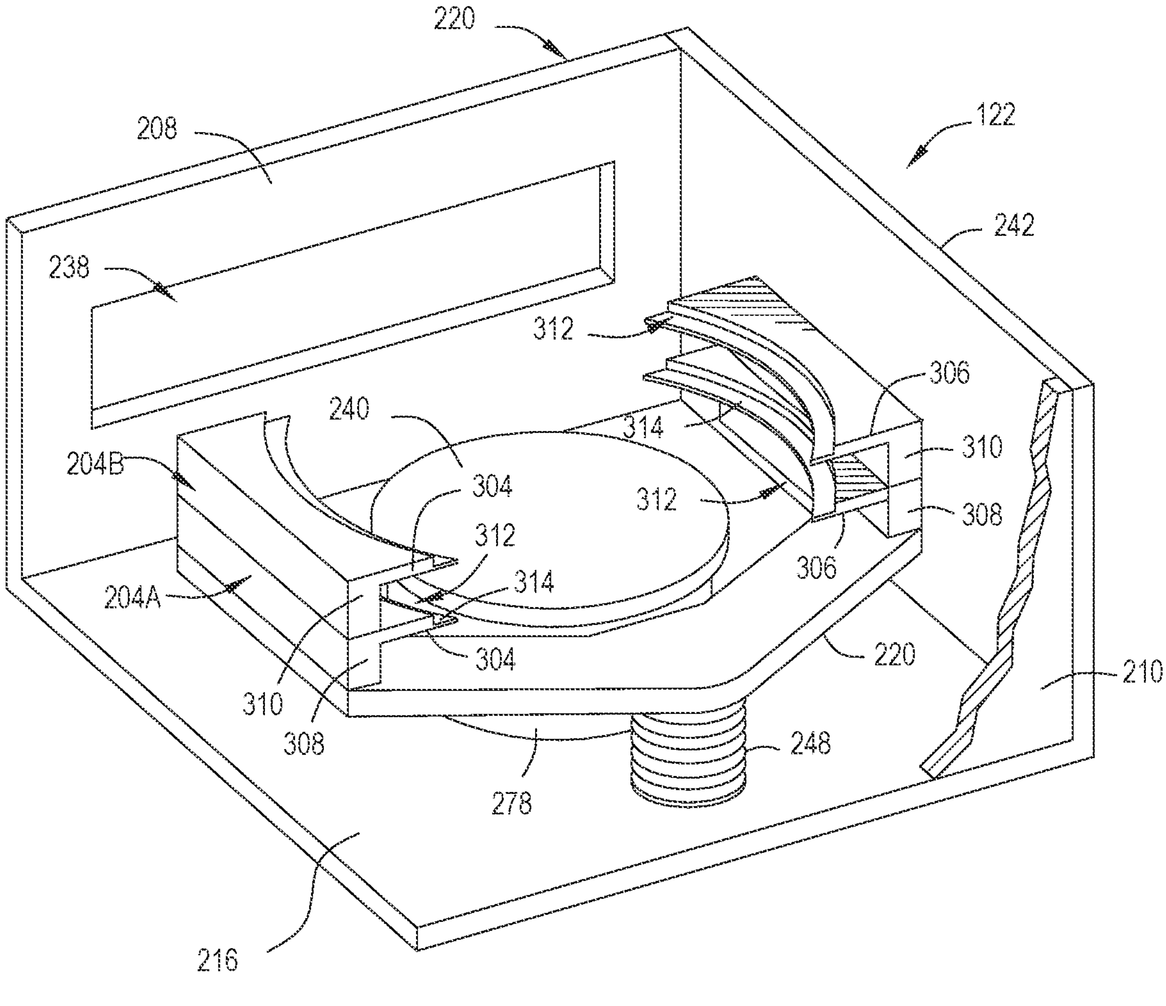
FIG. 3A depicts one embodiment of the carrier holders in the load lock chamber.

FIG. 3A depicts one embodiment of the carrier holders 204B, 204A in the substrate input/output chamber 122. The carriers 206 are not shown in FIG. 3A for clarity. The second carrier holder 204A is generally held above the bottom 216 of the chamber body 202 by the support 220. A first standoff 308 is disposed between each member 304, 306 to maintain the second carrier holder 204A in a spaced-apart relation to the support 220. A second standoff 310 is disposed between the first and second carrier holders 204B, 204A to maintain a spaced-apart relation therebetween. The standoffs 308, 310 allow blades 134, 116 of the transfer and factory interface robots 130, 114 to pass therebetween when retrieving and depositing substrates on the carrier holders 204B, 204A. Each holder 204B, 204A may have alternatively include a "L-shaped" configuration that incorporates a portion that maintains a spaced-apart relation between holder 204B, 204A and adjacent components of the substrate input/output chamber 122.

Each carrier holder 204B, 204A includes a first member 304 and a second member 306. Each member 304, 306 includes a curved inner portion 312 that has a lip 314 extending radially inwards therefrom. The curved inner portion 312 is configured to allow the substrate 124 to rest on the lip 314. The curved inner portion 312 captures the substrate 124 therebetween, thus preventing the substrate 124 from falling off the lip 314. The first member 304 faces the second member 306, with the curved inner portions 312 of each pointing toward the other. The first member 304 and the second member 306 are on opposite sides of a temperature control pedestal 240 that is centrally disposed within the chamber 122 and projects from the bottom 216 thereof.

Figure 3B:
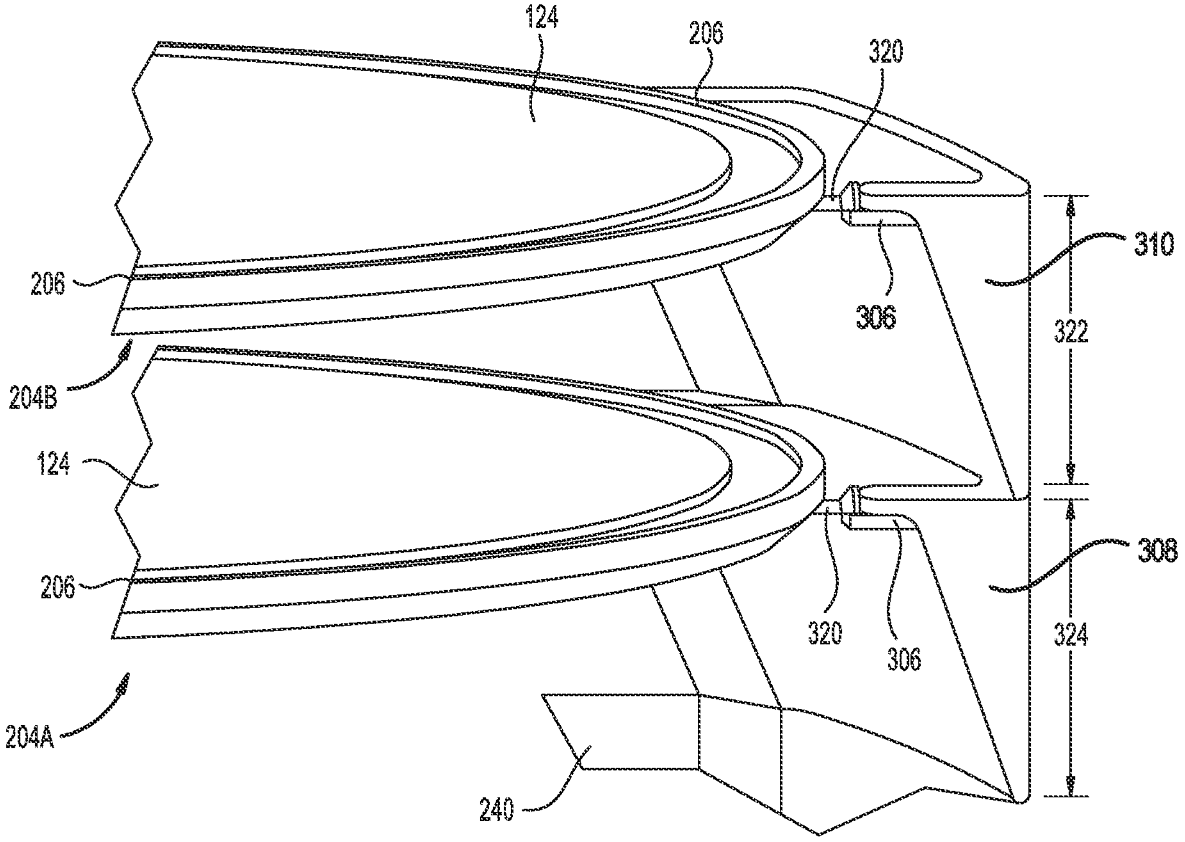
FIG. 3B is an isometric view of another embodiment of the first carrier holder and the second carrier holder.

FIG. 3B is an isometric view of another embodiment of the first carrier holder 204B and the second carrier holder 204A. Each of the first carrier holder 204B and the second carrier holder 204A are shown supporting a carrier 206. Support members 320 are shown between the carrier 206 and the standoffs 308, 310. The carriers 206 may be transferred into the substrate input/output chamber 122 manually to initialize the system. For example, the carriers 206 may be placed onto the standoffs 308, 310 by opening the top 214 (shown in FIG. 2) or through one of the first loading port 238 or the second loading port 239. The positioning process will be described in detail below.

Each of the support members 320 may be fabricated from a quartz material. Each of the support members 320 interfaces with the standoffs 308, 310 via an interference fit or other suitable coupling method. The standoffs 308, 310 may be made of a metallic material, such as stainless steel. The standoffs 308, 310 may be separated by a pitch or distance 322 of about 1 inch. Each of the carriers 206 may be fabricated from a ceramic material, such as silicon carbide. A distance 324 between an upper surface of the temperature control pedestal 240 and a lower surface of the carrier 206 in the standoff 308 may be about 0.75 inches.

Referring back to FIG. 2, the temperature control pedestal 240 is coupled to the bottom 216 of the chamber body 202 by a support 278 centrally located in the chamber 202. The support 278 may be hollow or can include passages therethrough to allow fluids, electrical signals, sensor and the like to be coupled to the pedestal 240. The shaft 282 and lift mechanism 296 are positioned peripheral to the support 278.

The temperature control pedestal 240 has a temperature control surface 292 for thermal control of substrates in proximity to the temperature control surface 292. The temperature control pedestal 240 includes a heat transfer element 286, which may be a circulated water jacket, a thermoelectric device, such as a Peltier device, or other structure that may be utilized to control the temperature of the temperature control surface 292. For example, the heat transfer element 286 may include one or more tubes disposed in the cooling platen 280 and fluidly coupled to a cooling fluid source (not shown) to circulate cooling fluid through the cooling platen 280.

The support 220 having the carrier holders 204B, 204A coupled thereto may be lowered to a first position where an upper surface 292 of the cooling platen 280 is in close proximity or in contact with the substrate supported by the second carrier holder 204A. In the first position, the cooling platen 280 may be used to regulate the temperature of the substrate disposed on (or proximate to) the cooling platen 280. For example, a substrate returning from processing may be cooled in the substrate input/output chamber 122 during evacuation thereof by supporting the substrate during on the upper surface 292 of the cooling platen 280. Thermal energy is transferred from the substrate through the cooling platen 280 to the heat transfer element 286, to cool the substrate. After cooling the substrate, the carrier holders 204B, 204A may be raised towards the top 214 of the chamber body 202 to allow the robots 130, 114 to access to the substrate seated in the second substrate support 204A. Optionally, the holders 204B, 204A may be lowered to a position where the upper surface 292 is in contact or close proximity to the substrate supported by the first carrier holder 204B. In this position, the cooling platen 280 may be used to thermally regulate and heat the substrate.

Figure 4A:
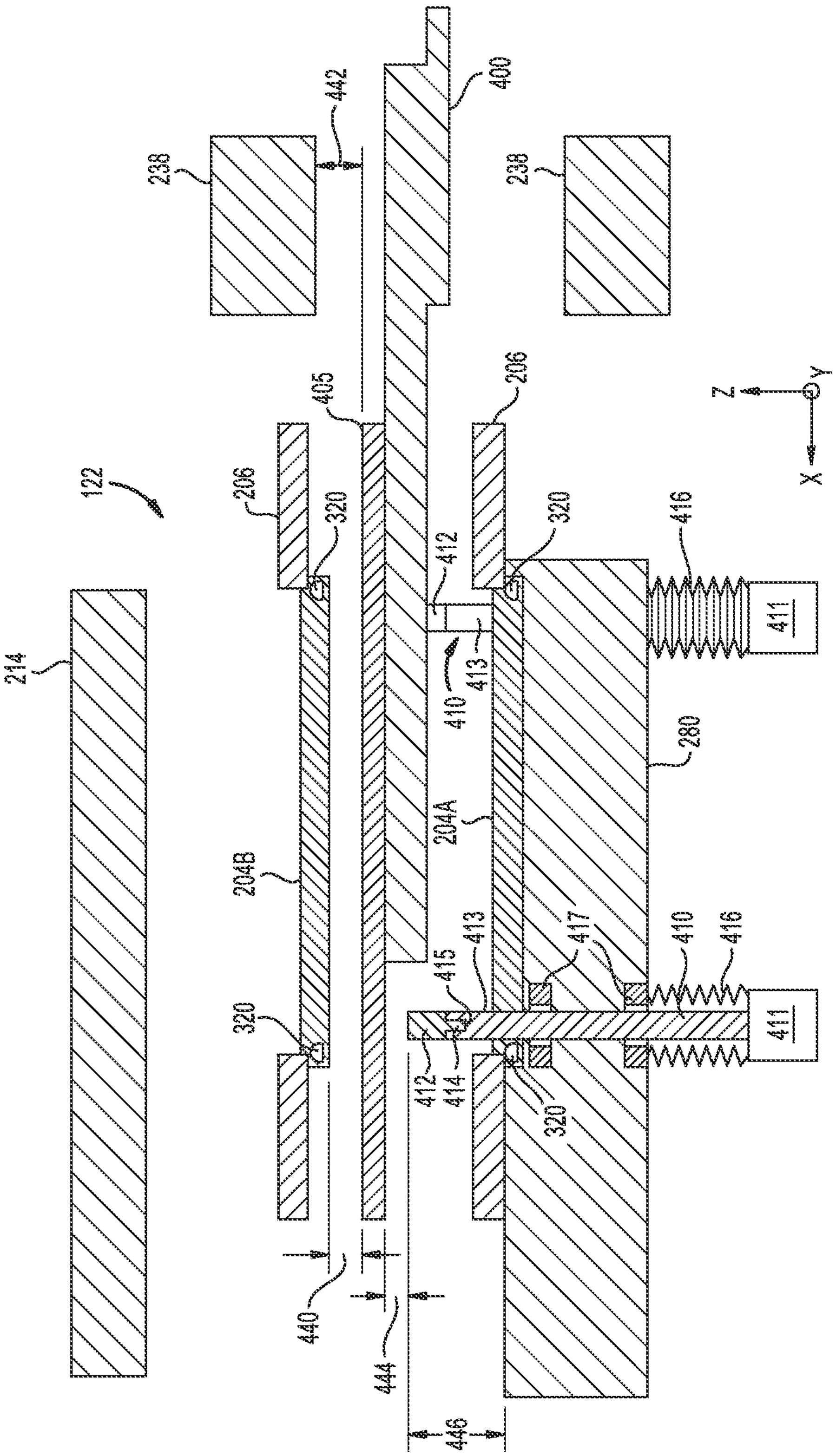
FIGS. 4A-4G are various views showing a substrate transfer sequence between the factory interface, the load lock chamber, and the transfer chamber of FIG. 1.

FIGS. 4A-4G are various views showing a substrate transfer sequence between the factory interface 102, the substrate input/output chamber 122, and the transfer chamber 136 of FIG. 1. FIG. 4A is a schematic side view of the substrate input/output chamber 122 showing a first robot blade 400 extending through the first loading port 238 of the substrate input/output chamber 122. The first robot blade 400 is shown supporting an unprocessed substrate 405 from the factory interface 102 of FIG. 1. The first robot blade 400 may be one of the blades 116 of the factory interface robot 114 shown in FIG. 1.

In addition to first loading port 238, the substrate input/output chamber 122 includes the cooling platen 280, the second carrier holder 204A, the first carrier holder 204B and carriers 206 disposed on the holders 204B, 204A via the support members 320. In addition, lift pins 410, one of which is shown in cross-section, extend through the cooling platen 280. Each of the lift pins 410 is coupled to an actuator 411 that moves the lift pin 410 in the Z direction. A bellows assembly 416 is provided between the cooling platen 280 and the actuator 411. A plurality of bushings 417 is also provided in the cooling platen 280 to facilitate vertical movement of the lift pins 410 therein.

Each of the lift pins 410 is configured to contact a lower surface of the substrate 405 on an edge thereof. Each of the lift pins 410 includes a tip 412 disposed on an end of a shaft 413. The tip 412 is made of a material that is softer than the material of the shaft 413. For example, the shaft 413 may be fabricated from a metallic material, such as stainless steel, while the tip 412 may be fabricated from a polymer material. The softer material for the tips 412 prevents or minimizes scratching of the backside of the substrate 405. Example materials for the tip 412 are fluoropolymers including polytetrafluoroethylene (PTFE), fluorinated ethylene propylene (FEP), perfluoroalkoxy (PFA), or other suitable plastic materials. The tips 412 may be designed to couple to a respective shaft 413 via an interference fit. In the embodiment shown in FIG. 4A, the tips 412 include a protruded portion 414 that snugly fits into a depression 415 formed in the shaft 413.

The first robot blade 400 extends into the substrate input/output chamber 122 through the first loading port 238 in the X direction. The first robot blade 400 is programmed to position the substrate 405 concentric with the carrier 206 disposed on the second carrier holder 204A.

Figure 4B:
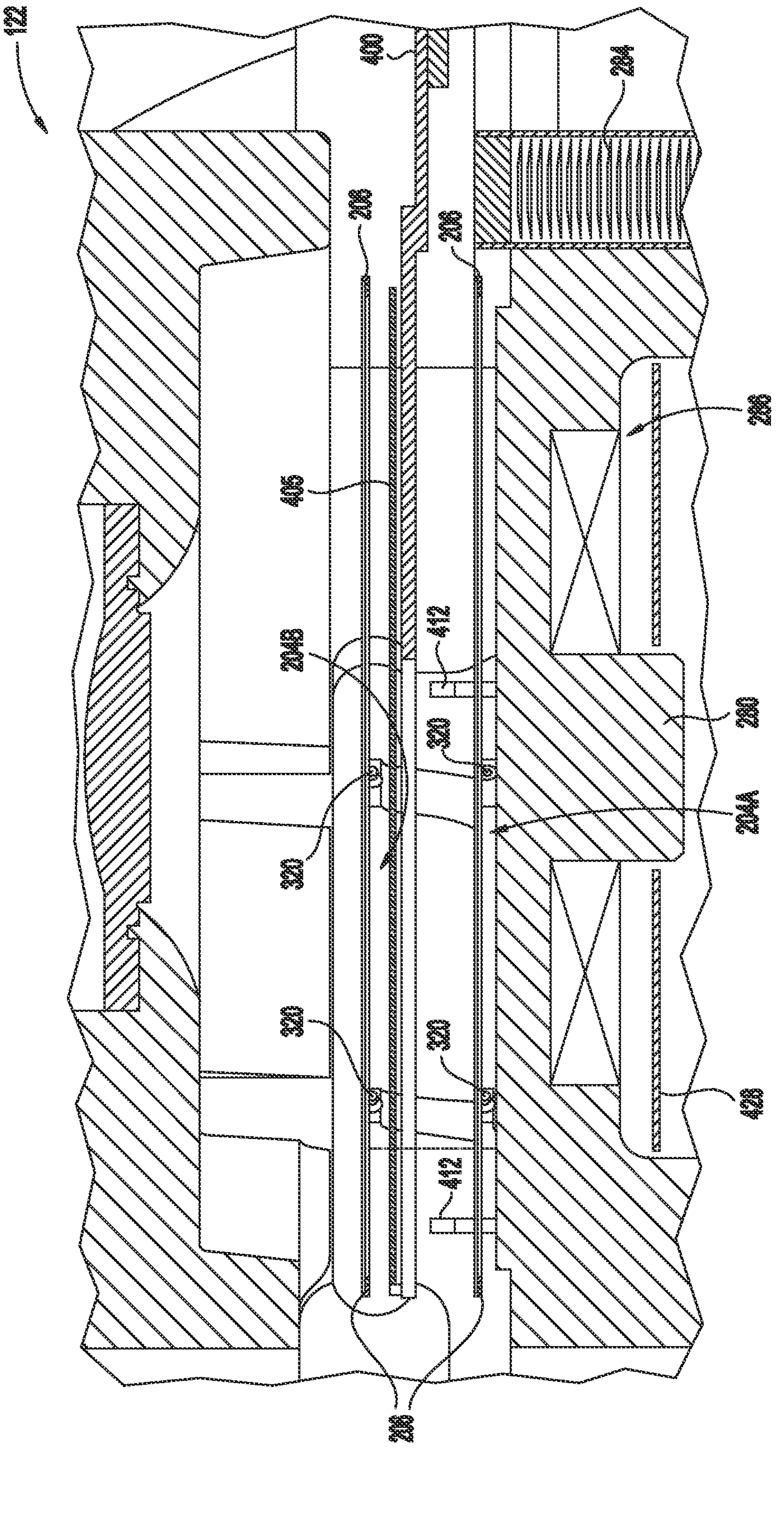
Figure 4C:
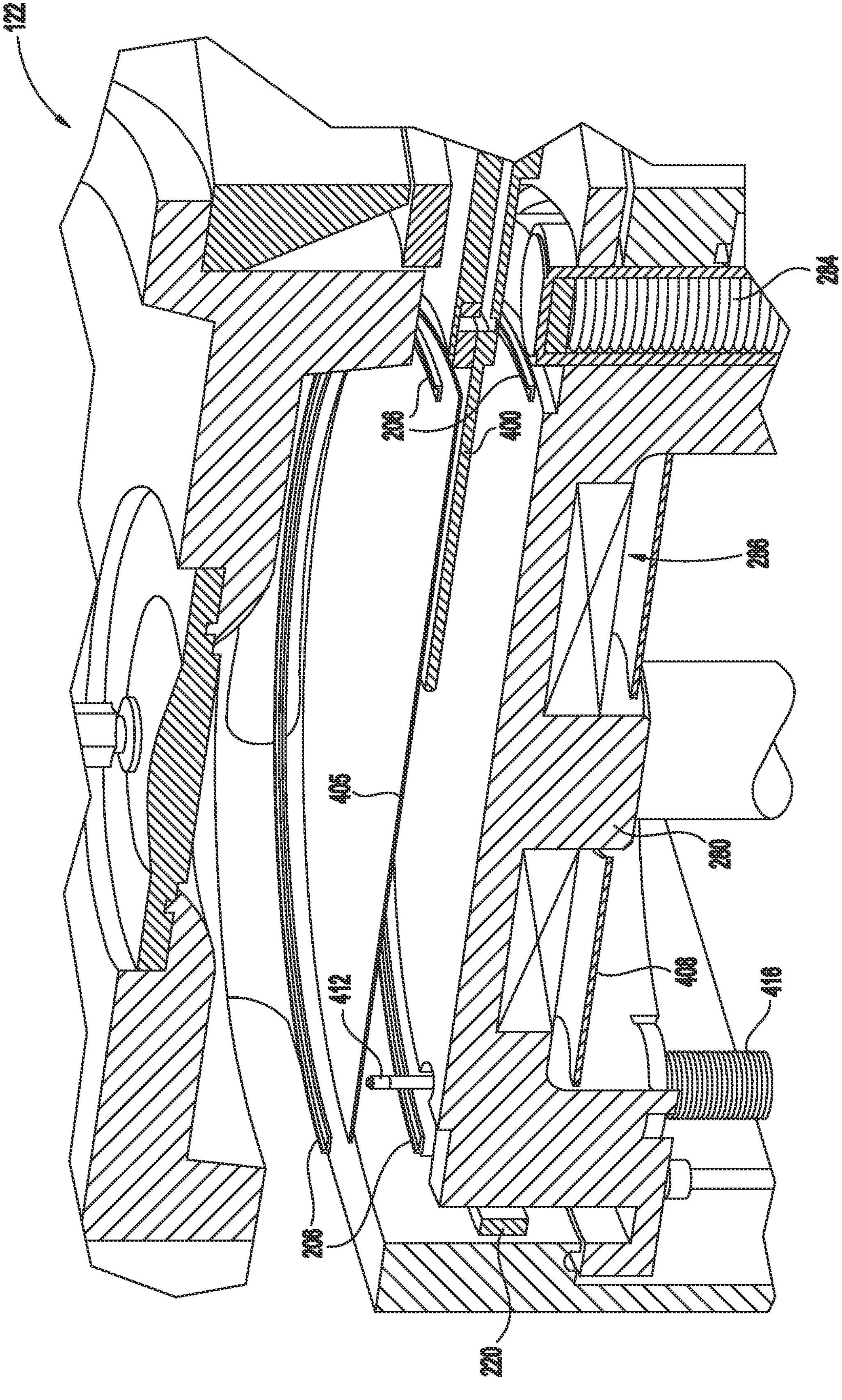

FIGS. 4B and 4C are schematic cross-sectional views of the substrate input/output chamber 122 when the first robot blade 400 is positioned as shown in FIG. 4A. In addition to the first robot blade 400, the carriers 206, and the substrate 405, the heat transfer element 286 is more clearly shown within the cooling platen 280. The heat transfer element 286 may be sealed into the cooling platen 280 using a cover plate 428. The cover plate 428 may be circular and fabricated from an aluminum material.

Referring again to FIG. 4A, the minimum clearance between the first robot blade 400 and any other component in the substrate input/output chamber 122 is about 0.12 inches during this transfer process. For example, a distance 440 between a lower surface of the support members 320 and an upper surface of the substrate 405 is about 0.12 inches; a distance 442 between an upper surface of the substrate 405 and a surface of the first loading port 238 is about 0.16 inches; a distance 444 between a lower surface of the substrate 405 and an upper surface of the tip 412 is about 0.2 inches; and a distance 446 between the upper surface of the tip 412 and an upper surface of the cooling platen 280 is about 0.60 inches, or greater.

Figure 4D:
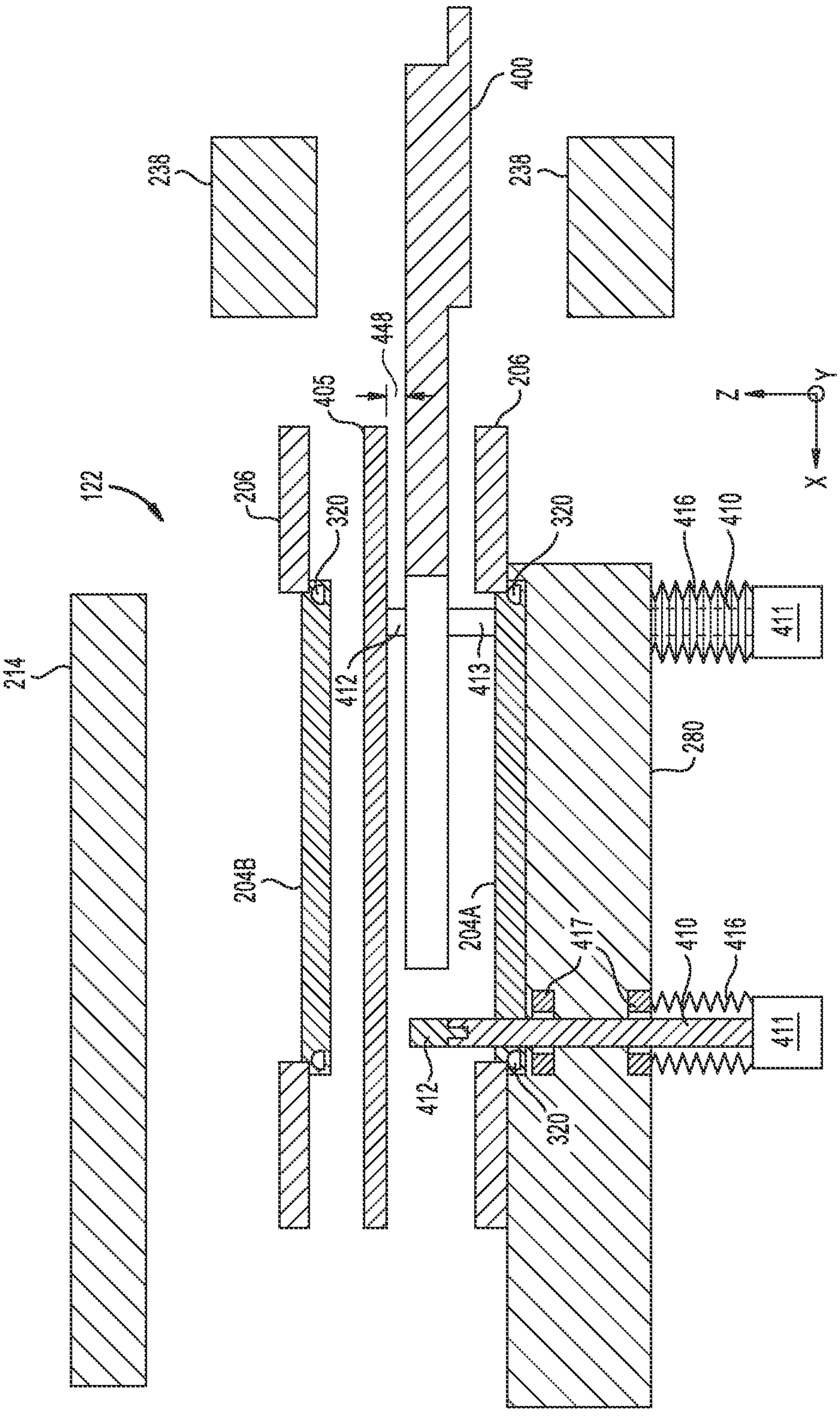

FIG. 4D is a schematic side view depicting another portion of the transfer process discussed in the description of FIGS. 4A-4C. FIG. 4D shows the substrate 405 transferred from the first robot blade 400 to the lift pins 410. The transfer of the substrate 405 to the lift pins 410 may be accomplished by vertical movement (Z direction) of the first robot blade 400. In this position, a distance 448 between the upper surface of the first robot blade 400 and a lower surface of the substrate 405 may be about 0.2 inches. A distance 450 between the lower surface of the first robot blade 400 and an upper surface of the carrier 206 may be about 0.13 inches in this position. In this position, the first robot blade 400 may be retracted from the substrate input/output chamber 122.

Figure 4E:
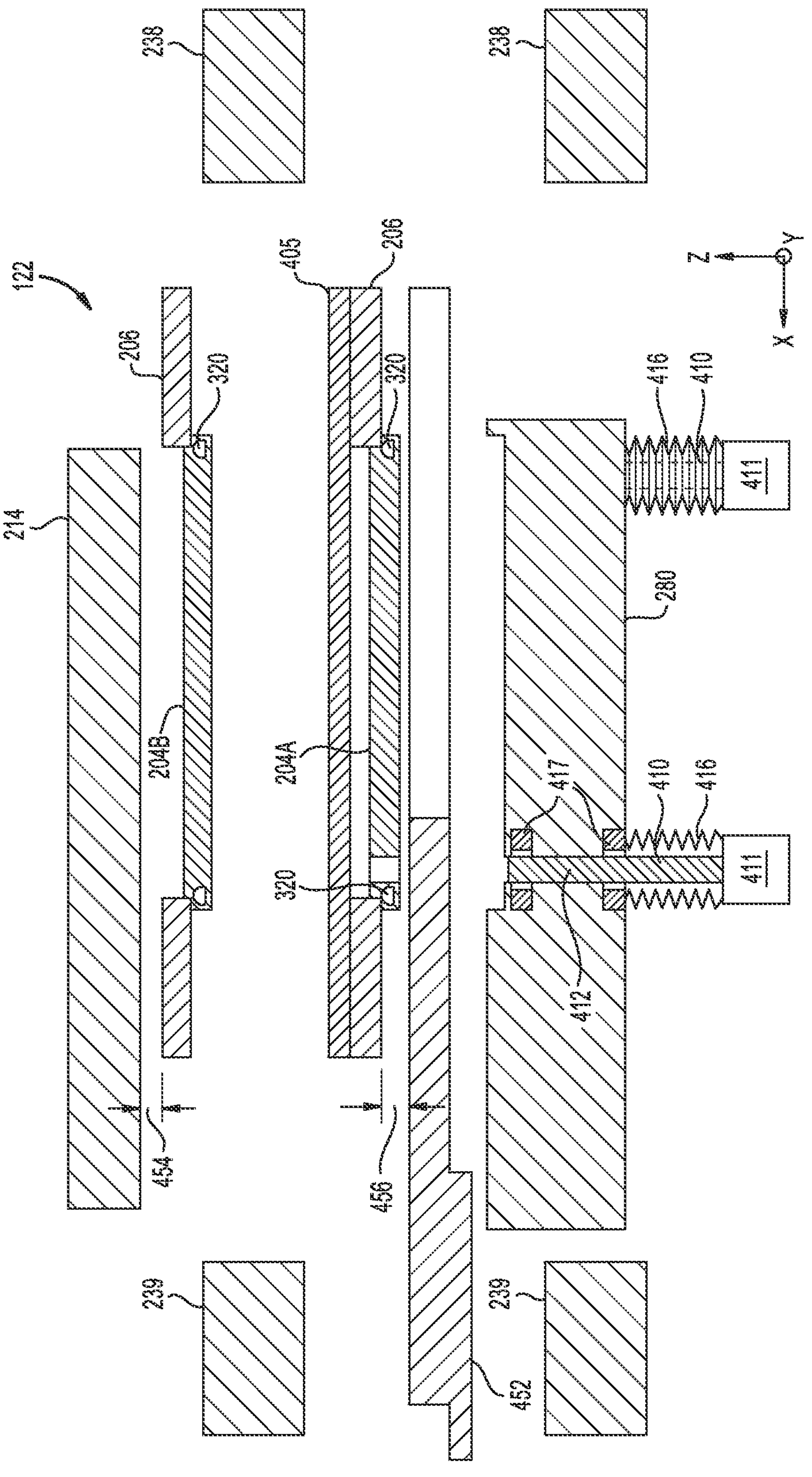

FIG. 4E is a schematic side view depicting another portion of the transfer process discussed in the description of FIGS. 4A-4D. FIG. 4E shows the substrate 405 transferred from the lift pins 410 to the carrier 206 disposed on the second carrier holder 204A. In this view, the support 220 (shown in FIG. 2), which moves the holders 204B, 204A in the Z direction, will be at its uppermost position. The uppermost position of the support 220 raises both of the holders 204B, 204A toward the top 214. Further, the lift pins 410 are retracted (lowered in the Z direction) which allows a second robot blade 452, from the transfer chamber 136, to enter the second loading port 239 as shown in FIG. 2. The second robot blade 452 may be the blade 134 of the vacuum robot 130 shown in FIG. 1.

The second robot blade 452 is utilized to transfer the substrate 405, as well as the carrier 206, to one or more of the processing chambers 110, 112, 132, 128, 120 shown in FIG. 1 via the transfer chamber 136. In the position shown in FIG. 4E, a distance 454 between a lower surface of the top 214 and the carrier 206 disposed on the first carrier holder 204B is about 0.25 inches, and a distance 456 between the upper surface of the second robot blade 452 and the lower surface of the carrier 206 may be about 0.19 inches. To transfer the substrate 405 to the second robot blade 452, the support 220 (FIG. 2) is lowered in the Z direction by greater than the distance 456. Thereafter, the second robot blade 452, having the carrier 206 and the substrate 405 thereon, may be retracted out of the second loading port 239 in the X direction.

Figure 4F:
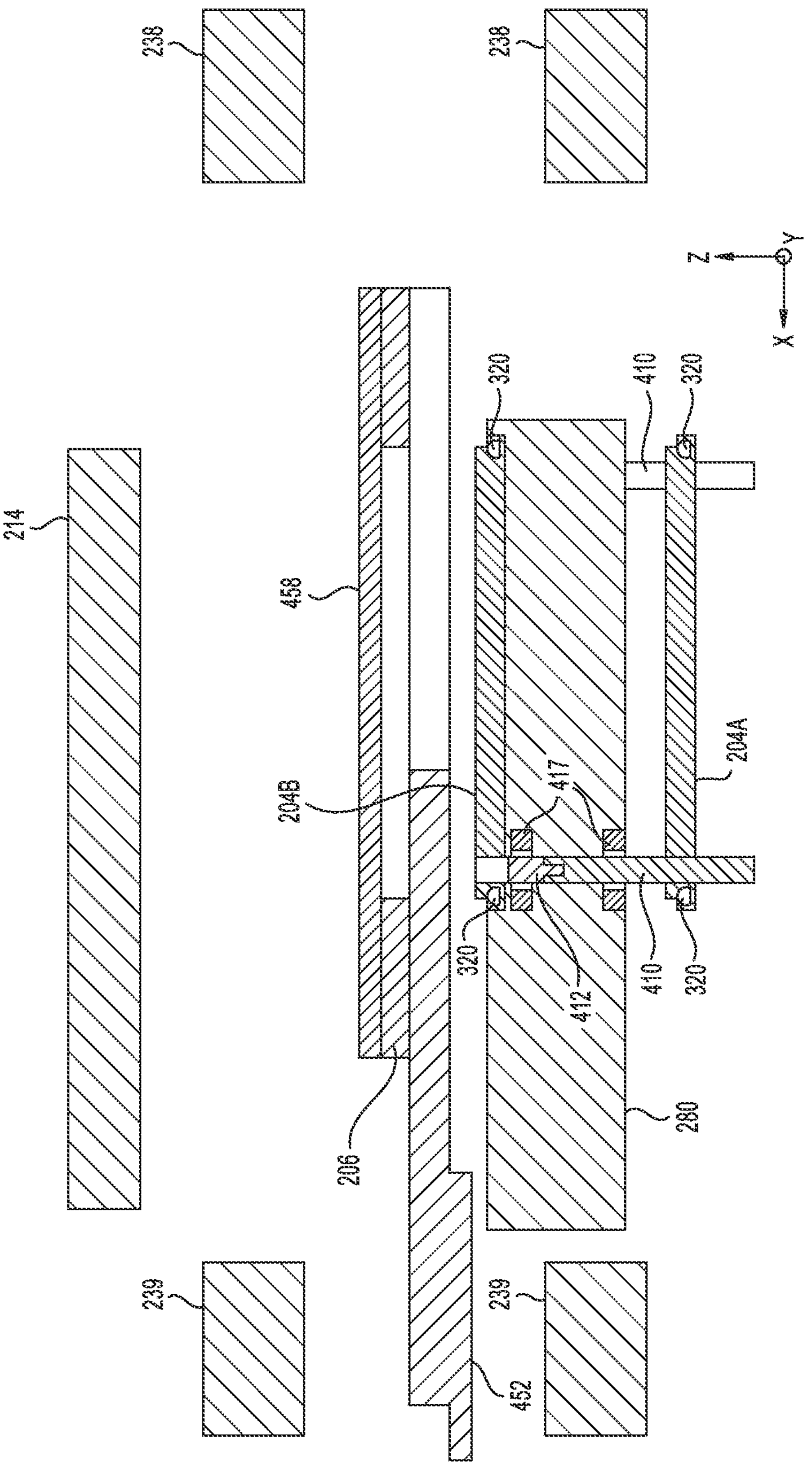

FIG. 4F is a schematic side view depicting another portion of the transfer process discussed in the description of FIGS. 4A-4E. FIG. 4F shows a processed substrate 458 from the transfer chamber 136 (shown in FIG. 1) supported by the carrier 206, which is supported by the second robot blade 452. In this transfer process, the support 220 is at the lowermost position such that a space between the top 214 and the first carrier holder 204B is provided. In addition, the lift pins 410 are retracted. The substrate 458 is shown in FIG. 4F with the carrier 206 concentrically aligned with the first carrier holder 204B.

Figure 4G:
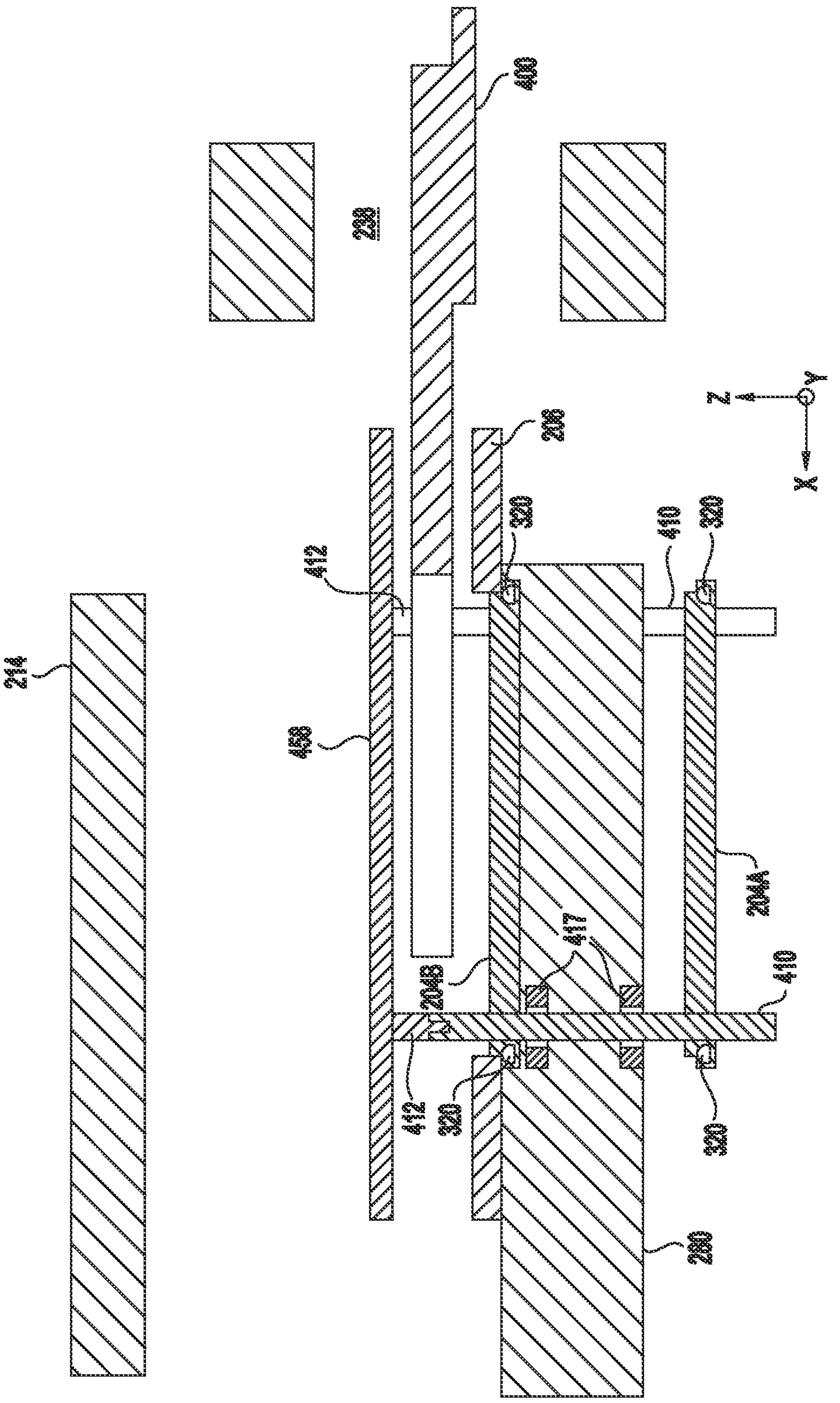

FIG. 4G is a schematic side view depicting another portion of the transfer process discussed in the description of FIGS. 4A-4F. In between the positions shown in FIGS. 4F and 4G, the lift pins 410 are actuated vertically (in the Z direction) from the position shown in FIG. 4F to the position shown in FIG. 4G, which shows the substrate 458 supported by the lift pins 410. Further, the carrier 206 is supported by the first carrier holder 204B. Once the substrate 458 is supported by the lift pins 410, as shown in FIG. 4G, the first robot blade 400 is actuated laterally (in the X direction) and/or vertically (in the Z direction) to remove the substrate 458 from the lift pins 410. Once the substrate 458 is supported by the first robot blade 400, the first robot blade 400, with the substrate 458 thereon, may be moved through the first loading port 238, and the substrate 458 may be placed in the factory interface 102.

Figure 5A:
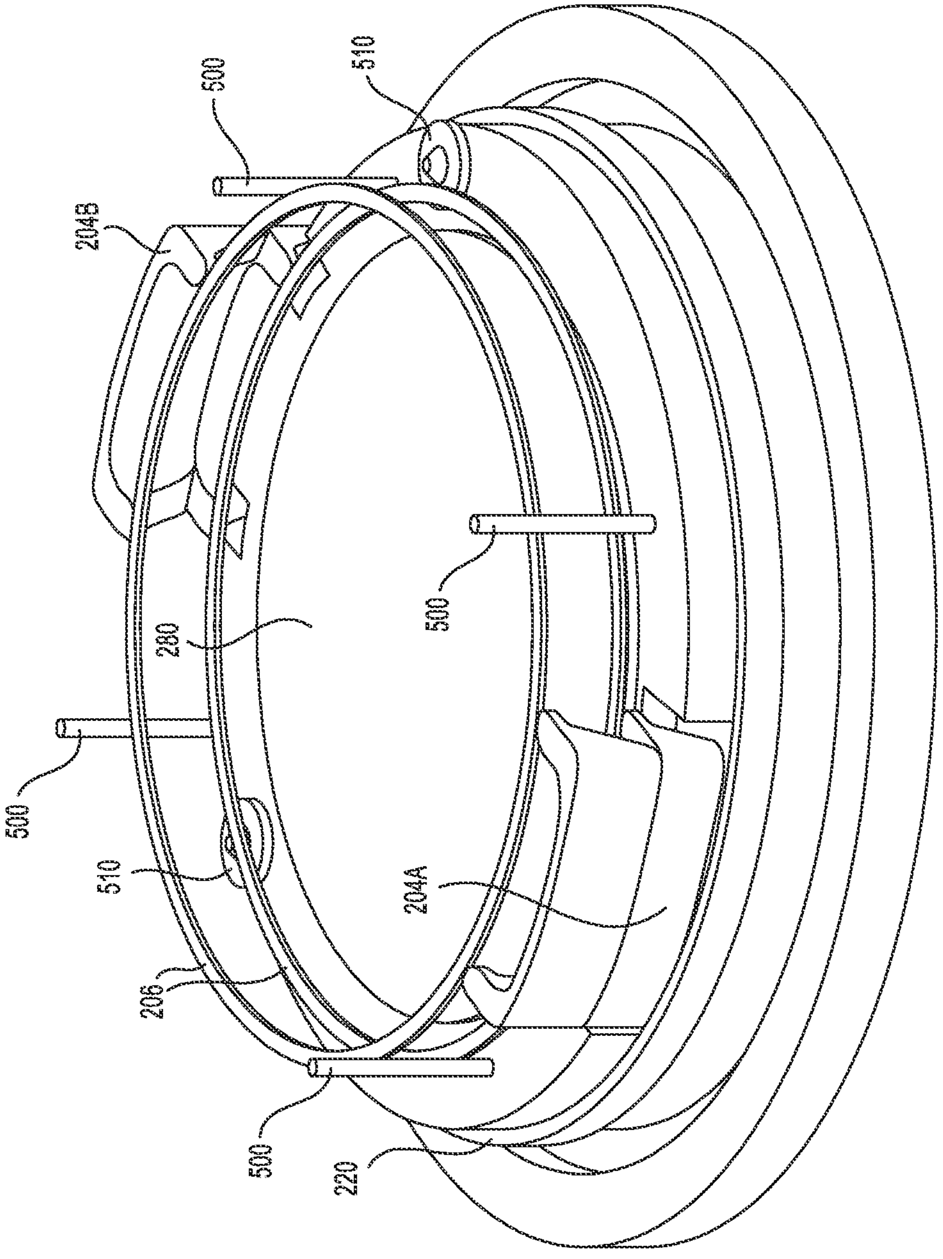
FIGS. 5A-5C are various view of the cooling platen and other components of associated with the cooling platen of the load lock chamber.
Figure 5B:
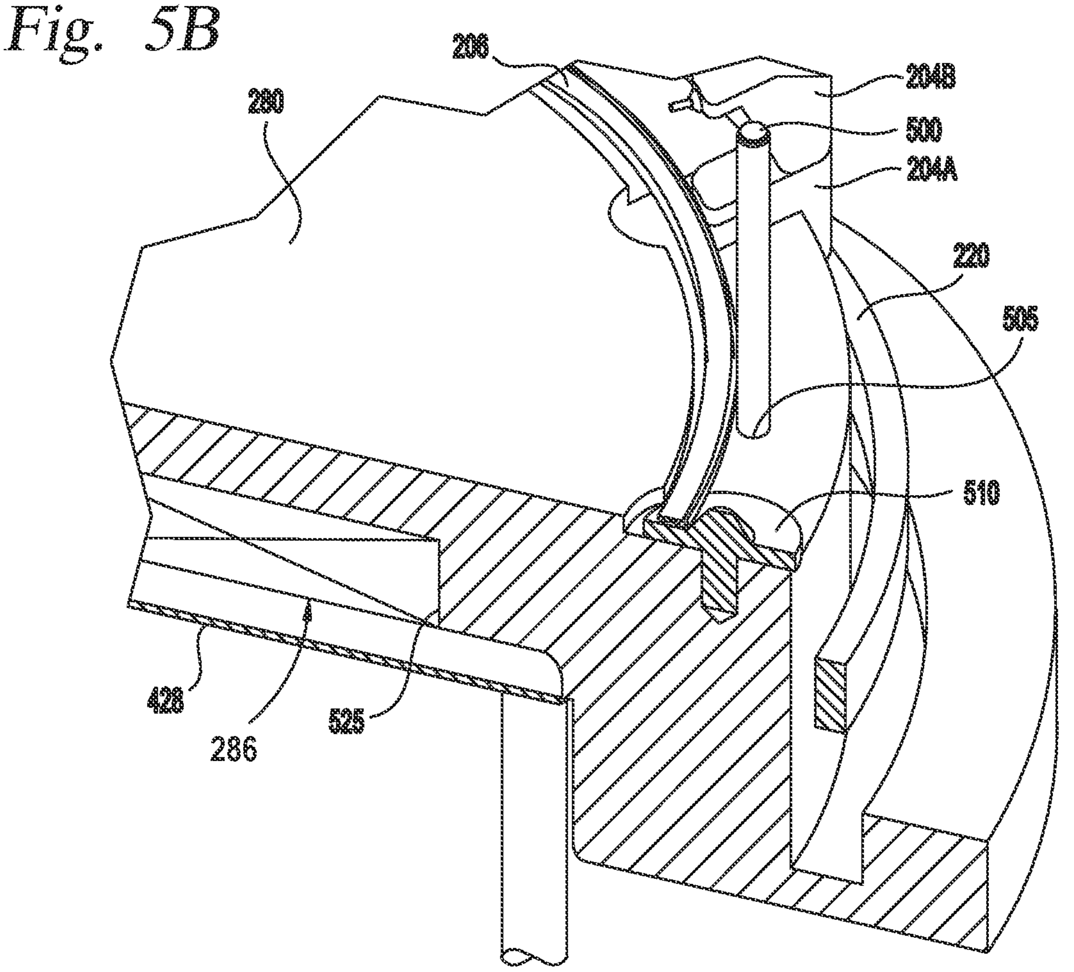
Figure 5C:
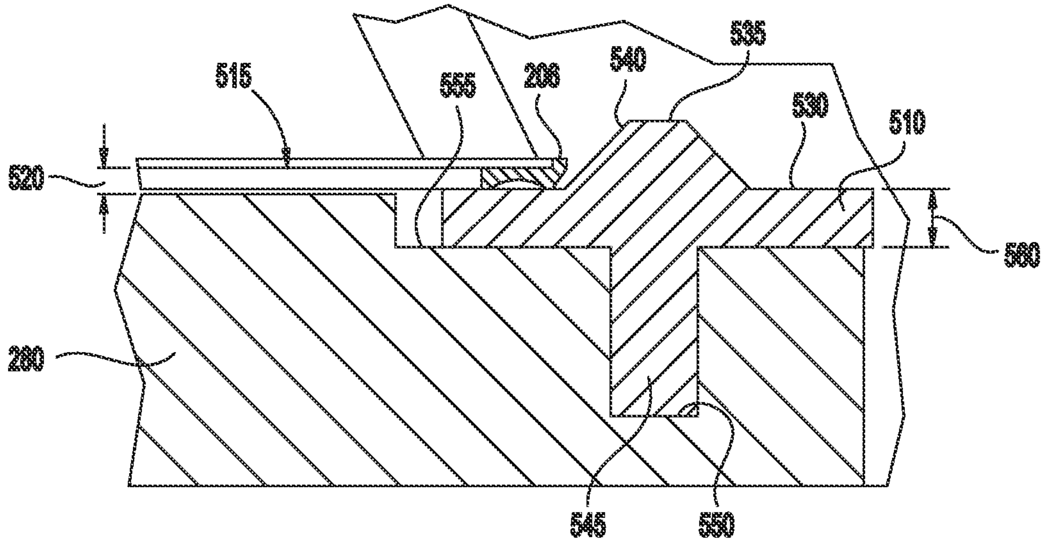

FIGS. 5A-5C are various view of the cooling platen 280 and other components of associated with the cooling platen 280 of the substrate input/output chamber 122. FIG. 5A is an isometric view of the cooling platen 280, and the first carrier holder 204B and the second carrier holder 204A coupled to the support 220. FIG. 5B is an isometric partial sectional view of the cooling platen 280, one of the carriers 206, and the support 220.

In FIG. 5A, a plurality of locating pins 500 are shown coupled to the cooling platen 280 in a peripheral region thereof. Each of the locating pins 500 is temporarily positioned within an opening 505 formed around the periphery of the cooling platen 280 (shown in FIG. 5B), and are utilized to center or position the carriers 206 onto the first carrier holder 204B and the second carrier holder 204A. The locating pins 500 define an outer edge location of a carrier 206 when positioned on one of the first or second carrier holders 204A or 204B. For example, the carriers 206 may be manually transferred into the substrate input/output chamber 122, and the locating pins 500 are utilized to position the carriers 206 with respect to the cooling platen 280. When the carriers 206 are positioned on the first or second carrier holders 204A, 204B, the locating pins 500 closely confine the outer edge of each carrier 206 to position the carriers 206 for processing. Once the carriers 206 are positioned, the locating pins 500 may be removed. Each of the locating pins 500 may be fabricated from a quartz material.

FIG. 5A also shows a plurality of alignment pads 510 coupled to the cooling platen 280. While only two pads 510 are shown in FIG. 5A, another pad is hidden by the first carrier holder 204B and the second carrier holder 204A.

Cross-sections of the pads 510 are shown in FIGS. 5B and 5C. Each of the pads 510 may be utilized to prevent contact between the carrier 206 and the cooling platen 280. Further, as the carrier 206 is supported by the pads 510 during cooling, contact between a substrate (not shown) and the platen 280 is prevented. For example, as the substrate would rest on a substrate receiving surface 515 of the carrier 206, the pads 510 provide a gap 520 between the upper surface of the cooling platen 280 and the substrate receiving surface 515 of the carrier 206. The substrate receiving surface 515 of the carrier 206 would coincide with a lower surface of a substrate mounted thereon, and the gap 520 would extend from the lower surface of the substrate to the upper surface of the cooling platen 280. Similar to the locating pins 500, the pads 510 are made from a quartz material.

FIG. 5C is an enlarged sectional view of the cooling platen 280, one pad 510 of the plurality of pads 510, and the carrier 206. Each of the pads 510 are generally "T"-shaped in cross-section and each pad 510 includes a planar shoulder portion 530 surrounding a protrusion 535 that extends from the shoulder portion 530. An angled surface 540 is provided between the shoulder portion 530 and the protrusion 535. Here the protrusion 535 is frustoconical. The angled surface 540 may be utilized to center the carrier 206 relative to the cooling platen 280. Each of the pads 510 also include a pin portion 545 that is inserted into an opening 550 formed in the cooling platen 280. The shoulder portion 530 fits into a recessed flange 555 of the cooling platen 280. A height 560 of the shoulder portion 530 is slightly greater than a depth of the recessed flange 555 in order to provide the gap 520.

Figure 6:
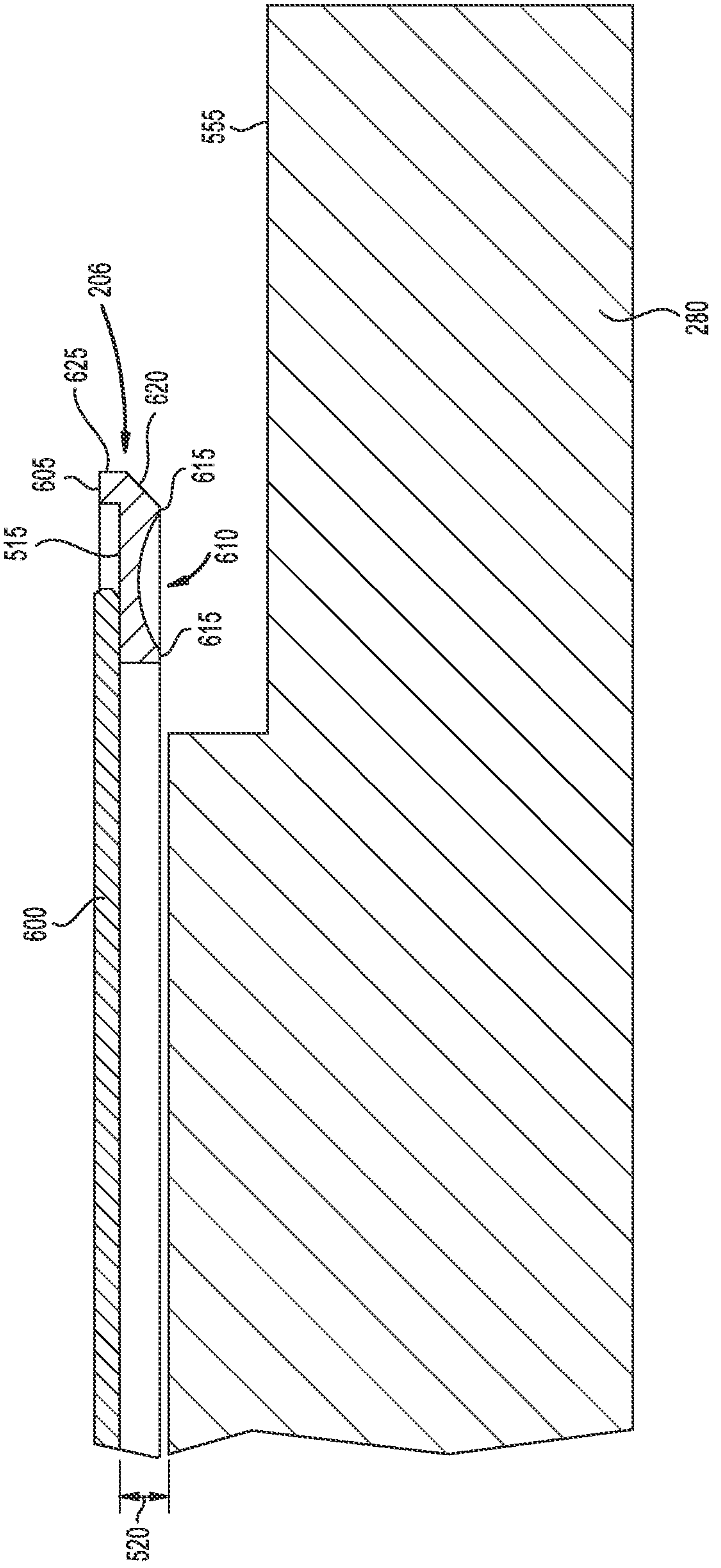
FIG. 6 is a schematic cross-sectional view of a portion of the cooling platen and the carrier.

FIG. 6 is a schematic cross-sectional view of a portion of the cooling platen 280 and the carrier 206. The carrier 206 has a substrate 600 supported on the substrate receiving surface 515 thereof. The carrier 206 includes a circular body 605 having a concave groove 610 formed in the body 605 opposite to the substrate receiving surface 515. Here, the circular body 605 is annular. Peripheral edges 615 adjacent to the concave groove 610 contact the shoulder portion 530 of the pads 510 (both shown in FIG. 5C). Contact between the peripheral edges 615 and the shoulder portion 530 (shown in FIG. 5C) provides the gap 520. A beveled edge 620 connects one of the peripheral edges 615 (e.g., an outer peripheral edge) with an outer wall 625. The beveled edge 620 may contact the angled surface 540 of the pads 510 (both shown in FIG. 5C).

Figure 7A:
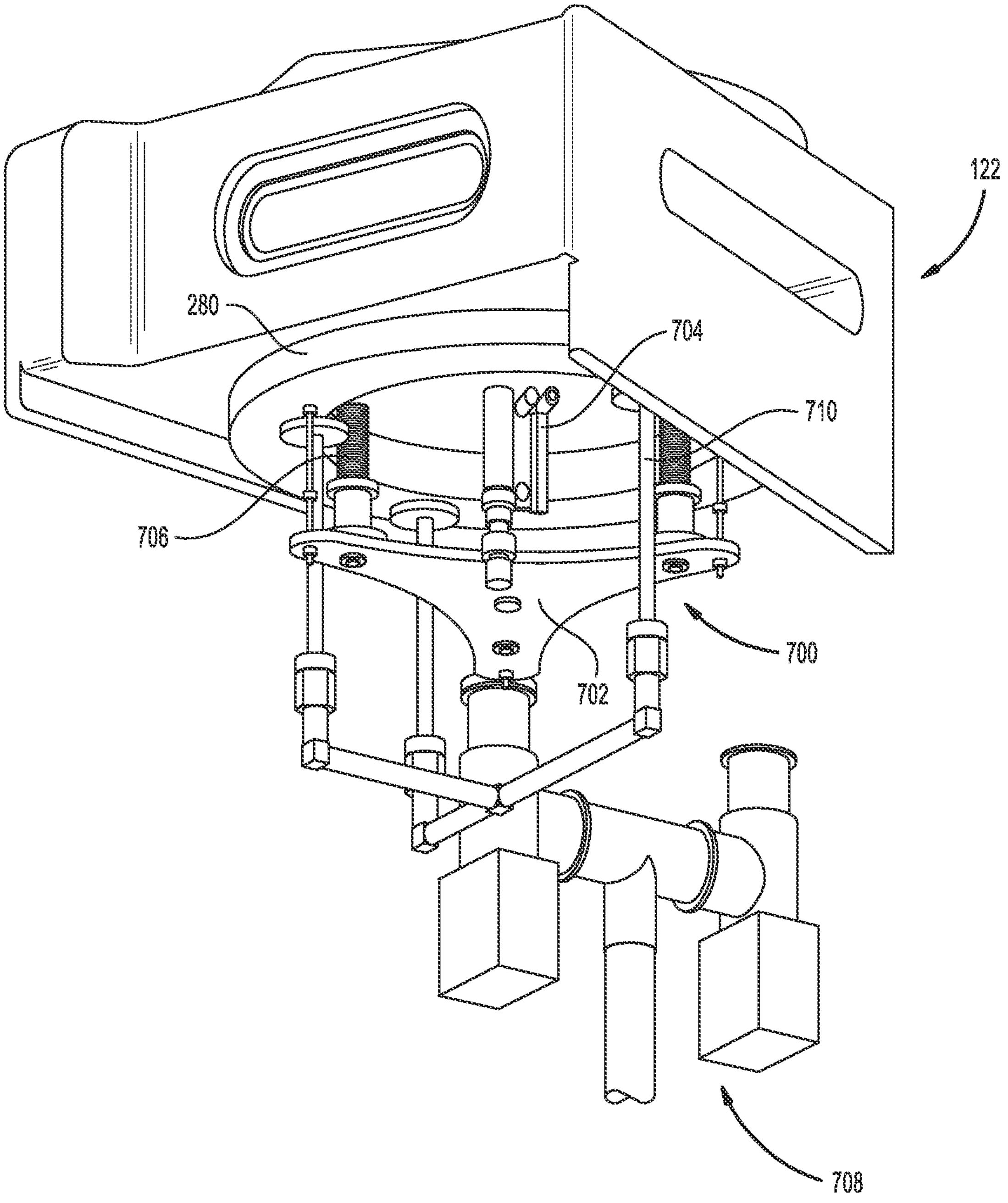
FIGS. 7A-7D are various views showing details of the load lock chamber.

FIGS. 7A-7D are various views showing details of the substrate input/output chamber 122. FIG. 7A is an isometric bottom view of the substrate input/output chamber 122 showing a substrate lift mechanism 700 that moves the lift pins 410. The substrate lift mechanism 700 includes a support plate 702 that supports a motor 704 that is coupled to the cooling platen 280 and a plurality of lift pin assemblies 706. Also shown is a vacuum system 708 having a plurality of primary vacuum tubes 710. The primary vacuum tubes 710 couple to the cooling platen 280 and are utilized to evacuate passages associated with the lift pins 410 disposed therein. The vacuum system 708 and the primary vacuum tubes 710 are in fluid communication with each other and will be described in more detail in FIG. 9A.

Figure 7B:
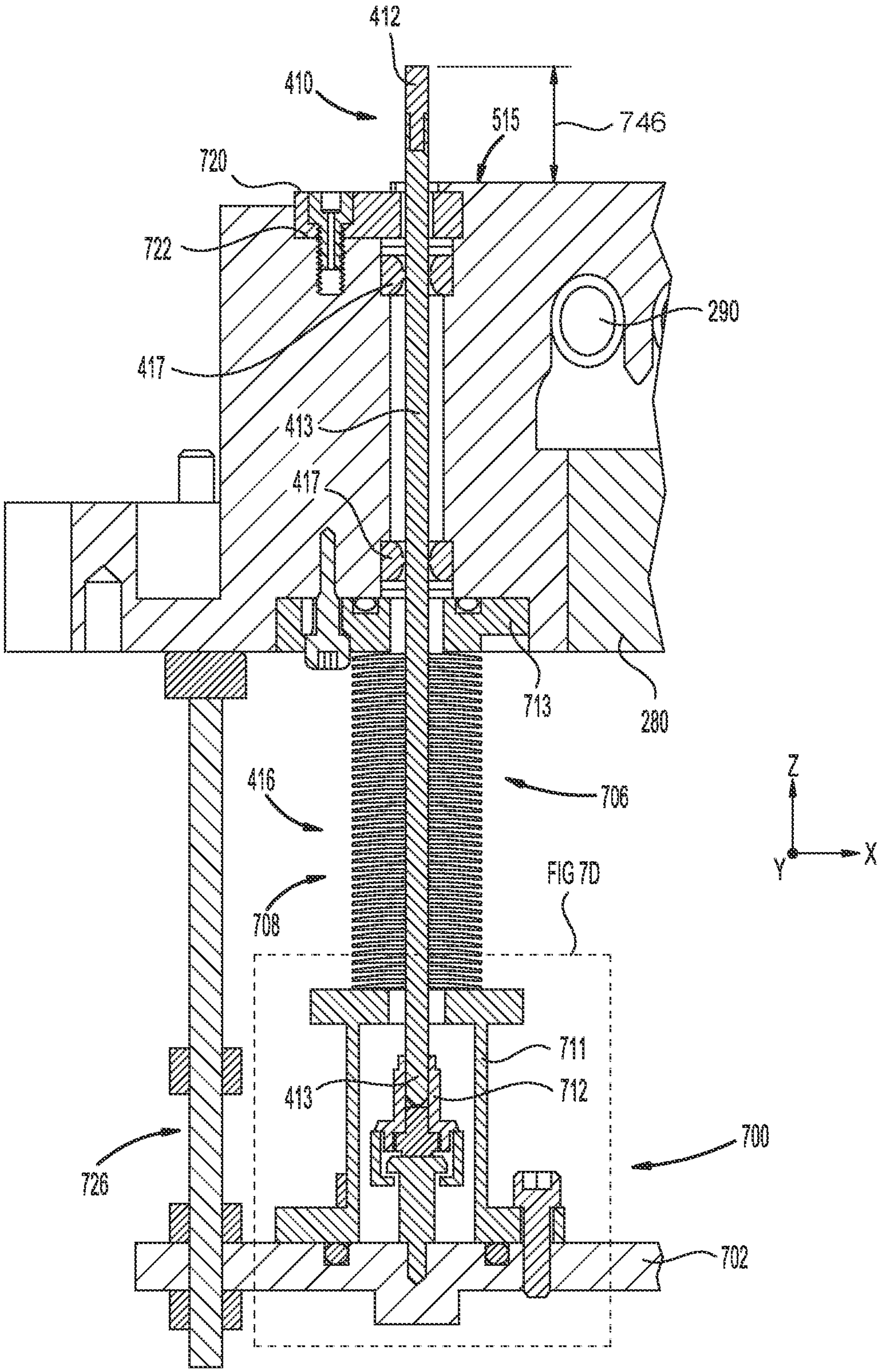
Figure 7C:
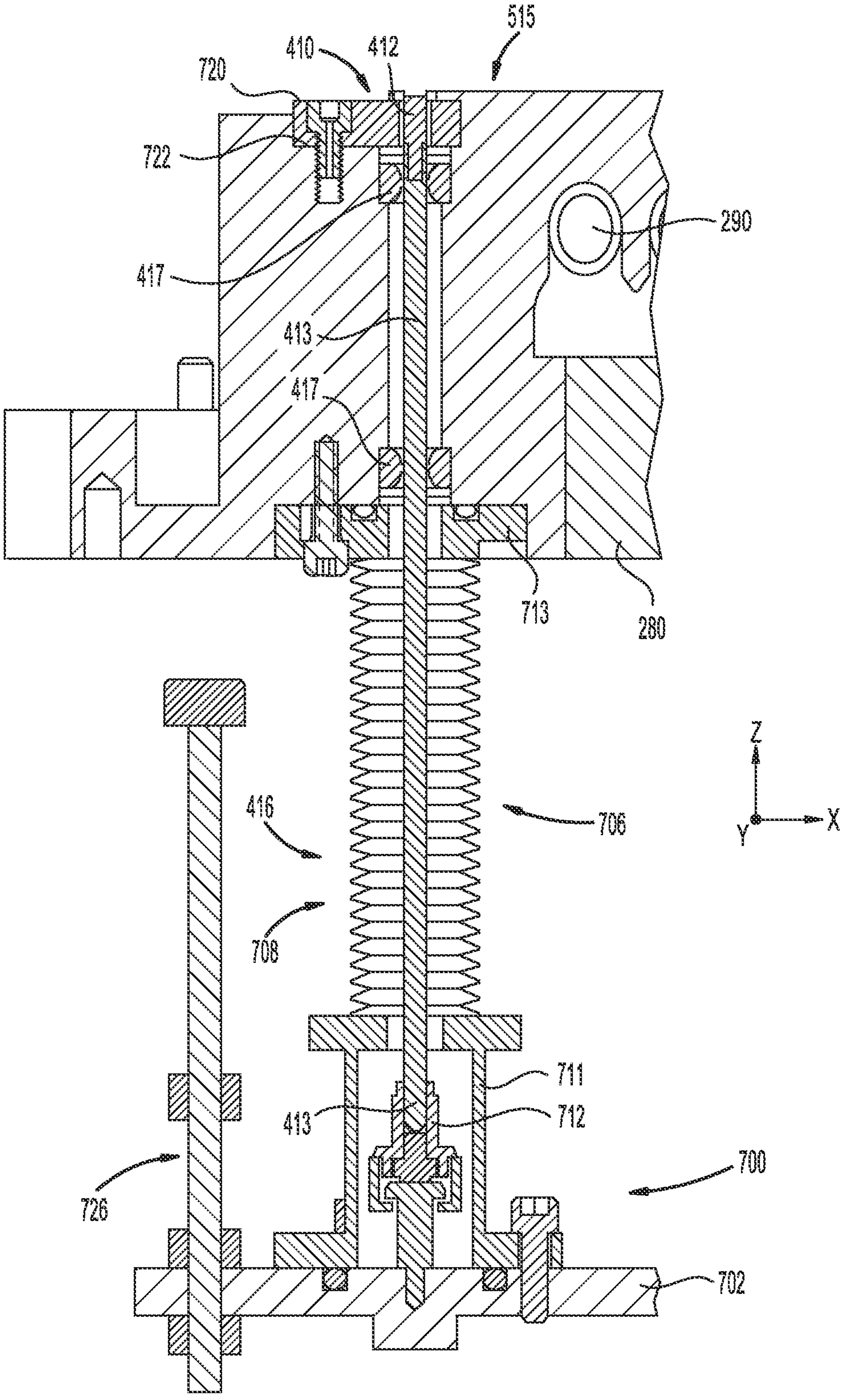
Figure 7D:
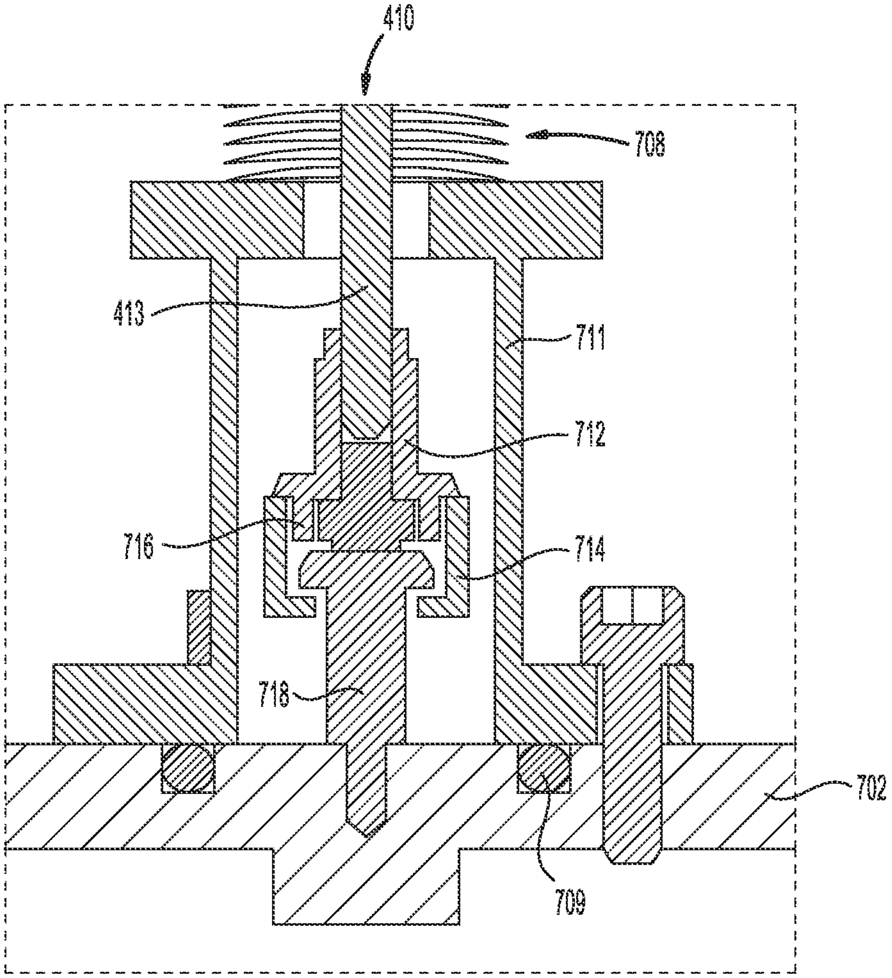

FIGS. 7B and 7C are side cross-sectional views of a portion of the cooling platen 280 showing a movement provided by the substrate lift mechanism 700. FIG. 7B shows the lift pin 410 in an extended position and FIG. 7C shows the lift pin 410 in a retracted position. As shown in FIG. 7B, a distance 746 is between the upper surface of the tip 412 and the substrate receiving surface 515. FIG. 7D is an enlarged sectional view of the substrate lift mechanism 700 of FIG. 7B. While only one lift pin 410 and associated substrate lift mechanism 700 is shown in FIGS. 7B-7D, it is noted that each lift pin 410 of the plurality of lift pins 410 on the support plate 702 will have an associated substrate lift mechanism 700.

As shown in FIGS. 7B-7D, the lift pin assembly 706 includes a bellows 708 disposed between the cooling platen 280 and a base housing 711 that is coupled to the support plate 702. The bellows 708 may be fabricated from a metallic alloy having a low coefficient of thermal expansion as well as high strength. In one example, the bellows 708 may be a Ni—Mo—Cr alloy, such as an alloy material sold under the trade name HAYNES® 242®. A seal 709, such as an O-ring, may be provided at the interface between the base housing 711 and the support plate 702. A mounting plate 713 may be coupled between the cooling platen 280 and the bellows 708. The mounting plate 713 may be coupled to the cooling platen 280 via fasteners.

A portion of the shaft 413 of the lift pin 410 is disposed in the base housing 711. For example, as best shown in FIGS. 7B and 7D, an end of the shaft 413 opposite to the tip 412 is coupled to a gripping member 712. The gripping member 712 may be fabricated from a plastic material usable in high heat environments, such as a polyimide-based polymer sold under the trade name VESPEL®. The gripping member 712 is coupled to a retainer housing 714. The retainer housing 714 receives a lip 716 of the gripping member 712 on one end thereof. The opposing end of the retainer housing 714 is coupled to a base pin 718. The base pin 718 may be coupled to the support plate 702. Materials for the base pin 718, the base housing 711, and the retainer housing 714 include metals, such as stainless steel.

Referring again to FIGS. 7B and 7C, the bushings 417 disposed about one of the lift pins 410 are shown. Each of the bushings 417 may be fabricated from a plastic material usable in high heat environments. Each of the bushings 417 may be secured by an internal retainer 724, such as a snap ring retainer. A limit member 726, which may be a bolt or threaded shaft, is shown coupled to the support plate 702. A height of the limit member 726 may be adjusted, such as in the Z direction, to limit the movement of the lift pin 410 in the Z direction, as shown in FIG. 7B.

Figure 8:
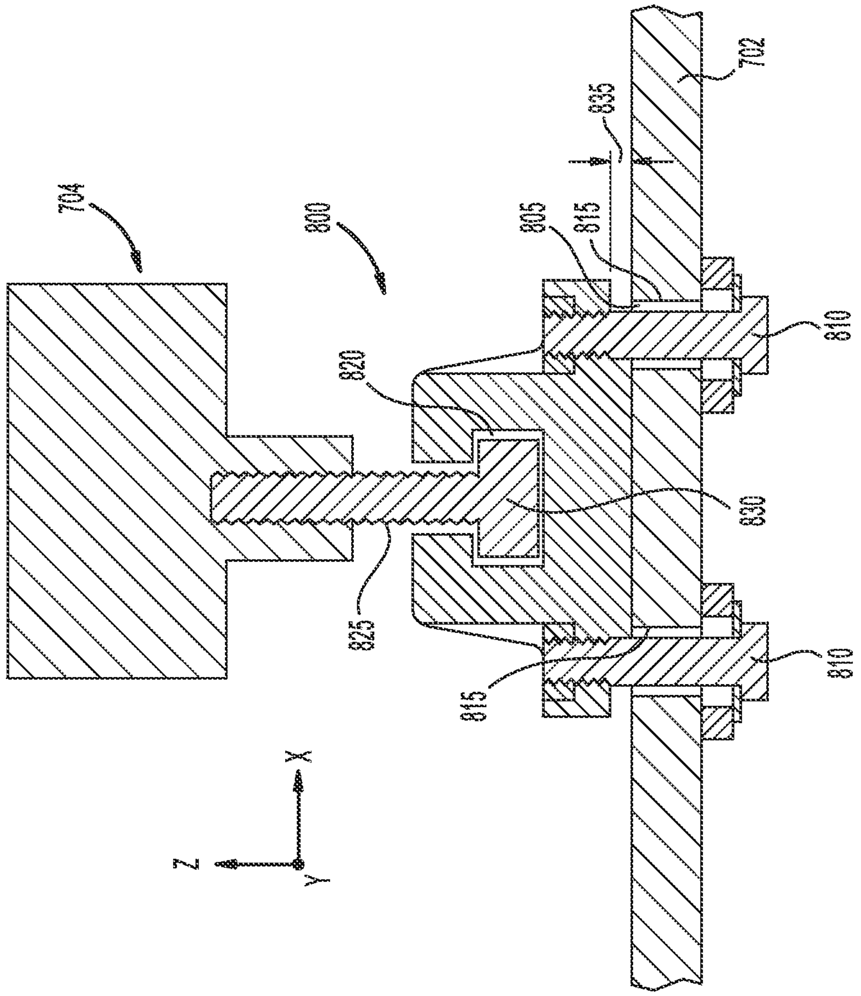
FIG. 8 is an enlarged sectional view of the motor coupled to the support plate via a flexible joint member.

FIG. 8 is an enlarged sectional view of the motor 704 coupled to the support plate 702 via a flexible joint member 800. The flexible joint member 800 includes a base 805 that is coupled to the support plate 702 by a plurality of base fasteners 810. Each of the base fasteners 810 passes through oversize holes 815 formed in the support plate 702. Each of the oversize holes 815 has a diameter greater than a diameter of the base fasteners 810, which allows passage of the base fasteners 810 through the holes 815 to fasten to the base 805. The base 805 includes a through-slot 820 that receives a portion of a central fastener 825. The central fastener 825 couples the motor 704 to the base 805. The through-slot 820 exposes at least a portion of a head 830 of the central fastener 825, which enables rotation of the central fastener 825 to move the central fastener 825 along the Z direction. When actuated, the flexible joint member 800 provides a gap 835 of a few millimeters between the support plate 702 and a peripheral region of the base 805.

Figure 9A:
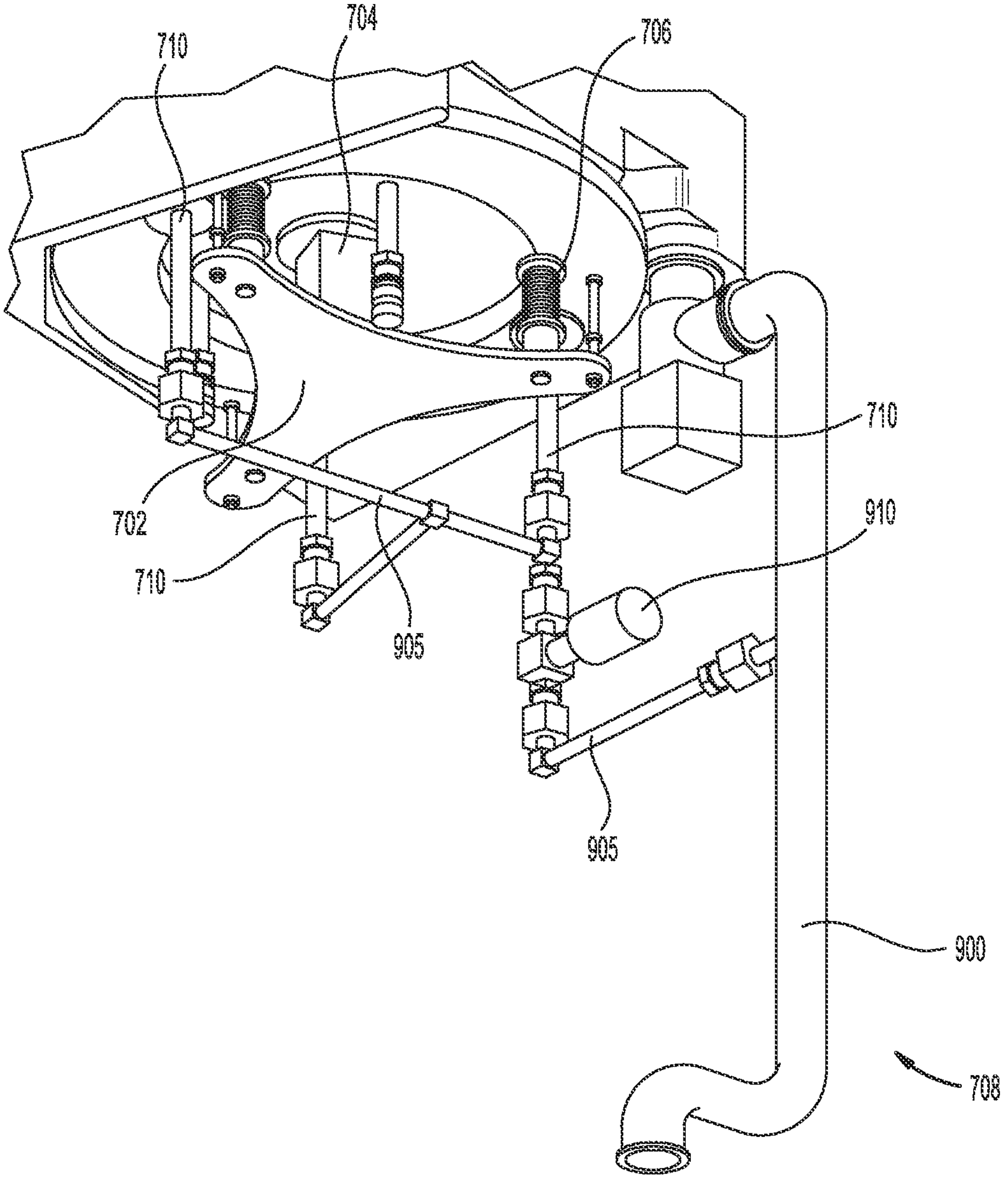
FIGS. 9A and 9B are isometric views of the load-lock chamber showing details of the vacuum system.
Figure 9B:
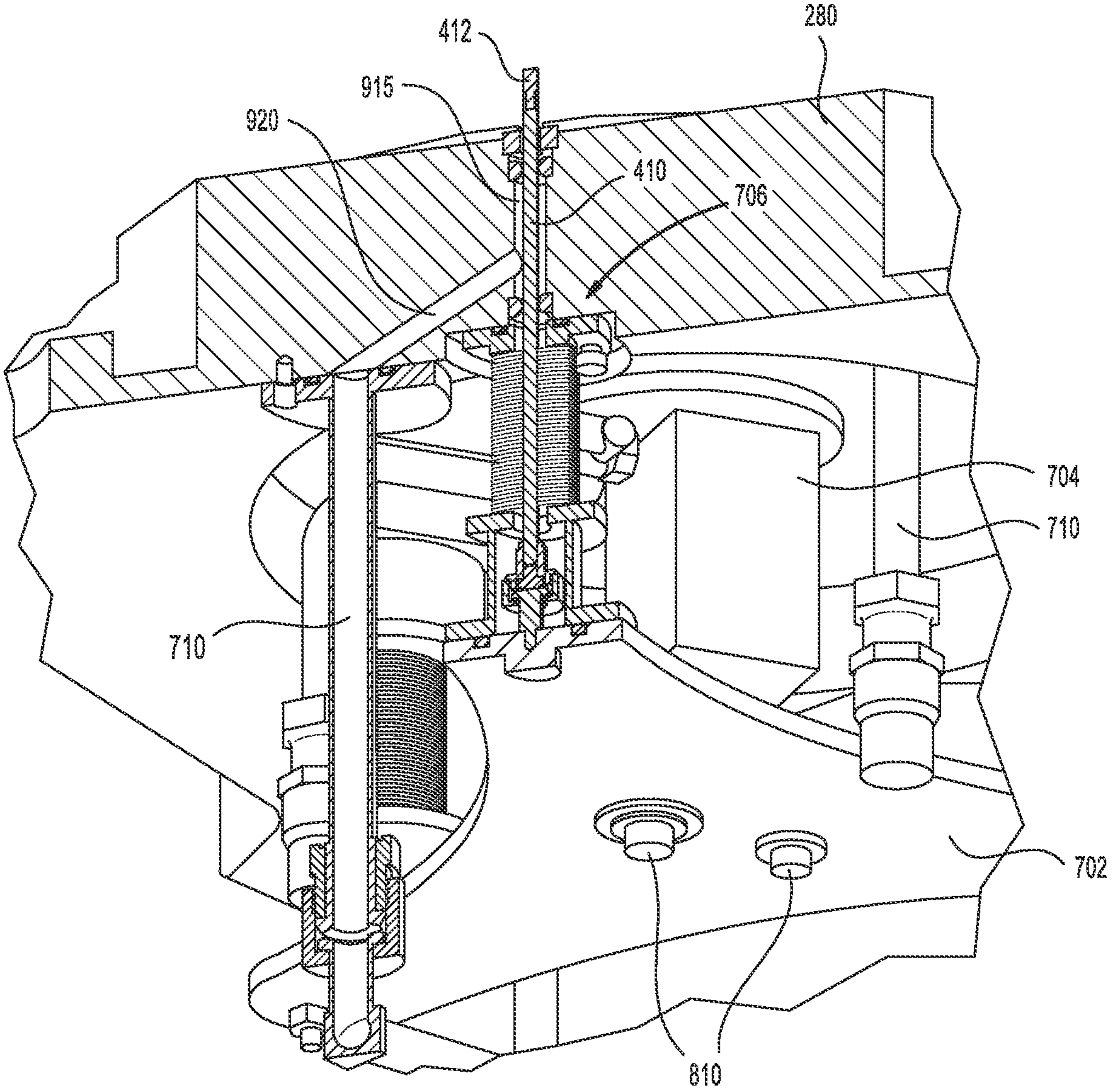

FIGS. 9A and 9B are isometric views of the substrate input/output chamber 122 showing details of the vacuum system 708. FIG. 9A is an isometric bottom view of the substrate input/output chamber 122 and FIG. 9B is an isometric sectional view of a bottom of the substrate input/output chamber 122.

In FIGS. 9A and 9B, the support plate 702 is disposed below the cooling platen 280, and the motor 704 as well as the plurality of lift pin assemblies 706 are coupled therebetween. A plurality of primary vacuum tubes 710 are shown in FIG. 9A. Each primary vacuum tube 710 is associated with a respective lift pin assembly 706 and is coupled to a fore line 900 by one or more secondary vacuum tubes 905. An isolation valve 910 is shown positioned between the primary vacuum tubes 710 and the fore line 900.

As shown in FIG. 9B, each of the primary vacuum tubes 710 (only one is shown in FIG. 9B) is fluidly coupled to a lift pin passage 915 by a bore 920, both of which are formed in the cooling platen 280. For example, the lift pin passage 915 is a through-hole formed between major surfaces of the cooling platen 280, and the bore 920 may be a passage formed along a length of the lift pin passage 915 to one major surface of the cooling platen 280, which interfaces with the primary vacuum tube 710. In operation, the vacuum system 708 is coupled to the fore line 900 which is coupled to the vacuum pump 236 (shown in FIG. 2). The vacuum pump 236, while utilized to evacuate the lift pin passage 915, is also utilized to evacuate the chamber volume 218 of the substrate input/output chamber 122.

Figure 10:
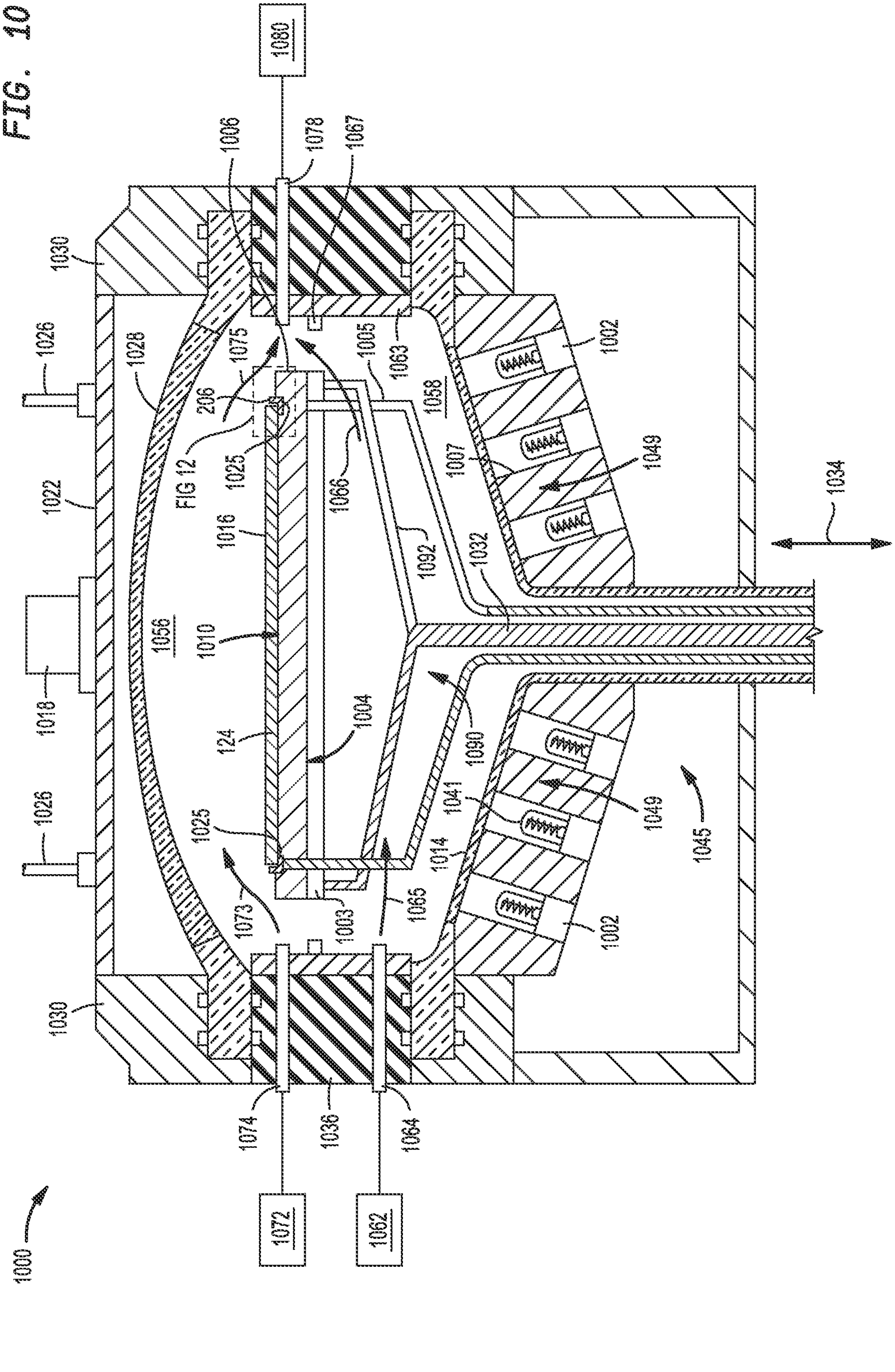
FIG. 10 is a schematic sectional view of a process chamber according to one embodiment.

FIG. 10 is a schematic sectional view of a process chamber 1000 according to one embodiment. The process chamber 1000 may be one or more of the processing chambers 110, 112, 132, 128, 120 shown in FIG. 1.

A susceptor 1006 is located within the process chamber 1000 between an upper dome 1028 and a lower dome 1014. The process chamber 1000 may be used to process one or more substrates, including the deposition of a material on an upper surface of a substrate 124. The process chamber 1000 may include an array of radiant heating lamps 1002 for heating, among other components, a back side 1004 of the susceptor 1006 disposed within the process chamber 1000. A "susceptor" as used herein is defined as an object that absorbs radiant energy and converts the absorbed radiant energy into heat energy that heats another object placed thereon or nearby. Although the process chamber 1000 includes the susceptor 1006, embodiments of the carrier 206 described herein may be used with other types of substrate supports or pedestals, and may be constructed similarly to the susceptor 1006. The upper dome 1028, the lower dome 1014 and a base ring 1036 that is disposed between the upper dome 1028 and lower dome 1014 generally define an internal region of the process chamber 1000. The substrate 124, with a device side 1016 facing up and positioned on a front side 1010 of the susceptor 1006 on a carrier 206 as described herein, can be brought into the process chamber 1000 and positioned onto the susceptor 1006 through a loading port 1003. The susceptor 1006 may be supported by a susceptor support structure 1090. The susceptor support structure 1090 includes at least three first support arms 1092 (only two are shown) supported by a central shaft 1032. In one embodiment, lowering the susceptor 1006 on the central shaft 1032 allows carrier lift pins 1005 to contact the carrier 206. The carrier lift pins 1005, passing through holes in the first support arms 1092 and holes in the susceptor 1006, raise the carrier 206 and the substrate 124 from the susceptor 1006. The carrier 206 may be disposed in a recess or groove 1025 formed in the front side 1010 of the susceptor 1006. The susceptor 1006, while located in the processing position as shown, divides the internal volume of the process chamber 1000 into a process gas region 1056 that is above the substrate 124, and a purge gas region 1058 below the susceptor 1006. The susceptor 1006 may be rotated as well as move the substrate 124 and the carrier 206 in an up and down direction 1034. The lamps 1002 may be configured to include bulbs 1041 and are used to heat the substrate 124. An optical pyrometer 1018 may be used for temperature measurements/control on the substrate 124. The lamps 1002 may be contained within a lamphead 1045. The lamphead 1045 may be cooled during or after processing by, for example, a cooling fluid introduced into channels 1049 located between the lamps 1002. Process gas supplied from a process gas supply source 1072 is introduced into the process gas region 1056 through a process gas inlet 1074 formed in the base ring 1036. The process gas exits the process gas region 1056 (along flow path 1075) through a gas outlet 1078 located on the side of the process chamber 1000 opposite the process gas inlet 1074. Removal of the process gas through the gas outlet 1078 may be facilitated by a vacuum pump 1080 coupled thereto. A circular shield 1067 or a preheat ring may be optionally disposed around the susceptor 1006. The susceptor 1006 may also be surrounded by a liner assembly 1063. The shield 1067 prevents or minimizes leakage of heat/light noise from the lamps 1002 to the device side 1016 of the substrate 124 while providing a pre-heat zone for the process gases. The liner assembly 1063 shields the processing volume (i.e., the process gas region 1056 and purge gas region 1058) from metallic walls of the process chamber 1000. The metallic walls may react with precursors and cause contamination in the processing volume. The shield 1067 and/or the liner assembly 1063 may be made from CVD SiC, sintered graphite coated with SiC, grown SiC, opaque quartz, coated quartz, or any similar, suitable material that is resistant to chemical breakdown by process and purging gases. A reflector 1022, secured to the upper dome 1028 using a clamp ring 1030, may be optionally placed outside the upper dome 1028. The reflector 1022 can have one or more channels 1026 for connection to a cooling source (not shown). The channel 1026 connects to a passage (not shown) formed on a side of the reflector 1022.

Figure 11:
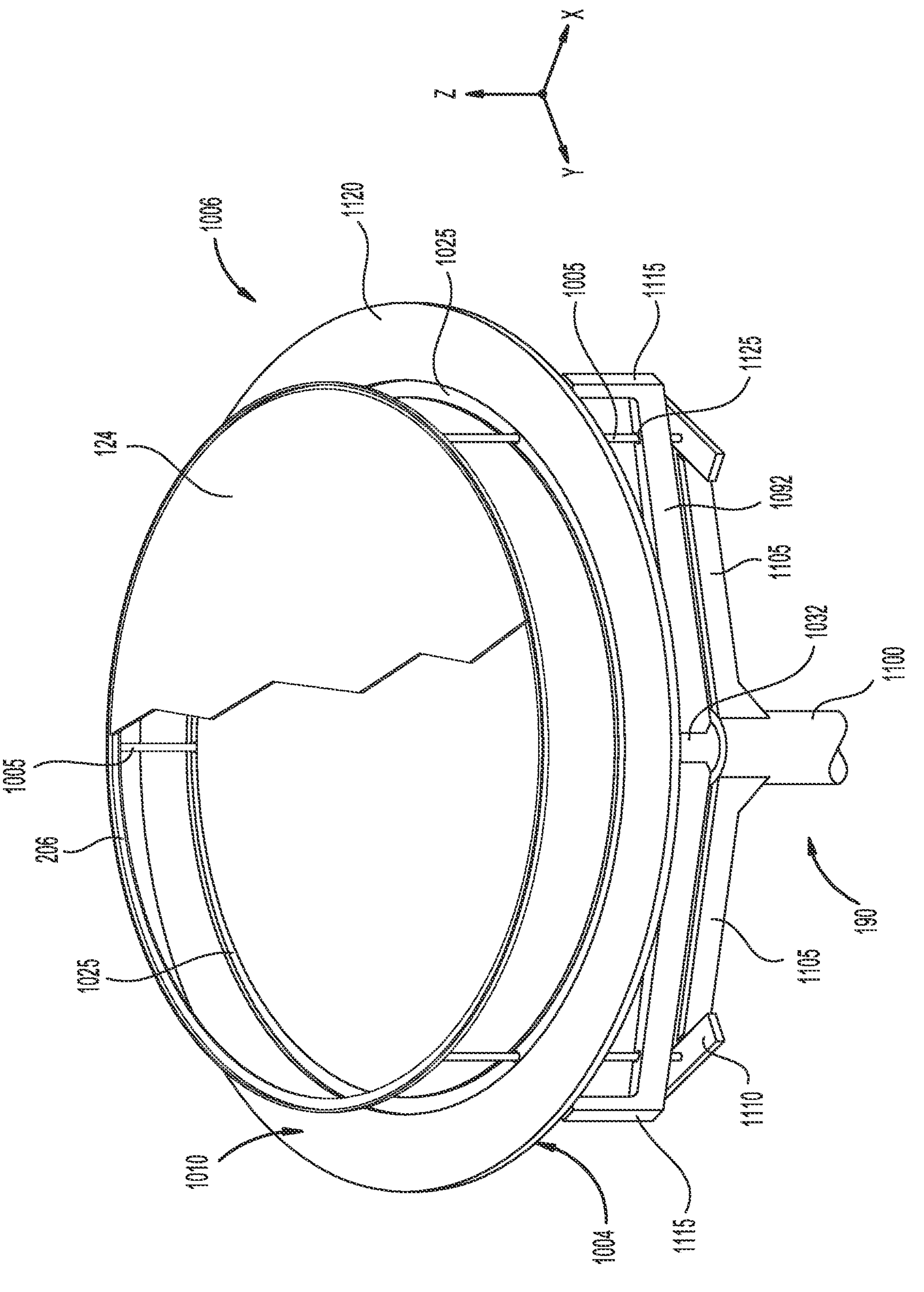
FIG. 11 is an isometric view of the susceptor of FIG. 10.

FIG. 11 is an isometric view of the susceptor 1006 of FIG. 10. The carrier 206 is supported by the carrier lift pins 1005 to space the substrate 124 (a portion of which is shown supported by the carrier 206) away from the front side 1010 of the susceptor 1006. The position of the carrier 206 and the substrate 124 shown in FIG. 11 may be a transfer position where a robot (not shown) may enter the space between the front side 1010 of the susceptor 1006 and the substrate 124.

The substrate support 190 includes the central shaft 1032 and an outer shaft 1100 disposed about the central shaft 1032. One or both of the central shaft 1032 and the outer shaft 1100 are linearly movable relative to the other. In one embodiment, the central shaft 1032 is movable in the Z direction while the outer shaft 1100 is stationary in order to raise or lower the susceptor 1006 relative to the carrier lift pins 1005. The carrier lift pins 1005 are disposed on second support arms 1105 that are generally parallel to the first support arms 1092. Ends of the second support arms 1105 include pads 1110 where the carrier lift pins 1005 are supported during transfer of the carrier 206. The first support arms 1092 include angled extensions 1115 that contact the back side 1004 of the susceptor 1006 at a perimeter 1120 thereof. The carrier lift pins 1005 are movably disposed through openings 1125 formed in the first support arms 1092 to allow the carrier lift pins 1005 to move in the Z direction relative to the first support arms 1092.

Figure 12:
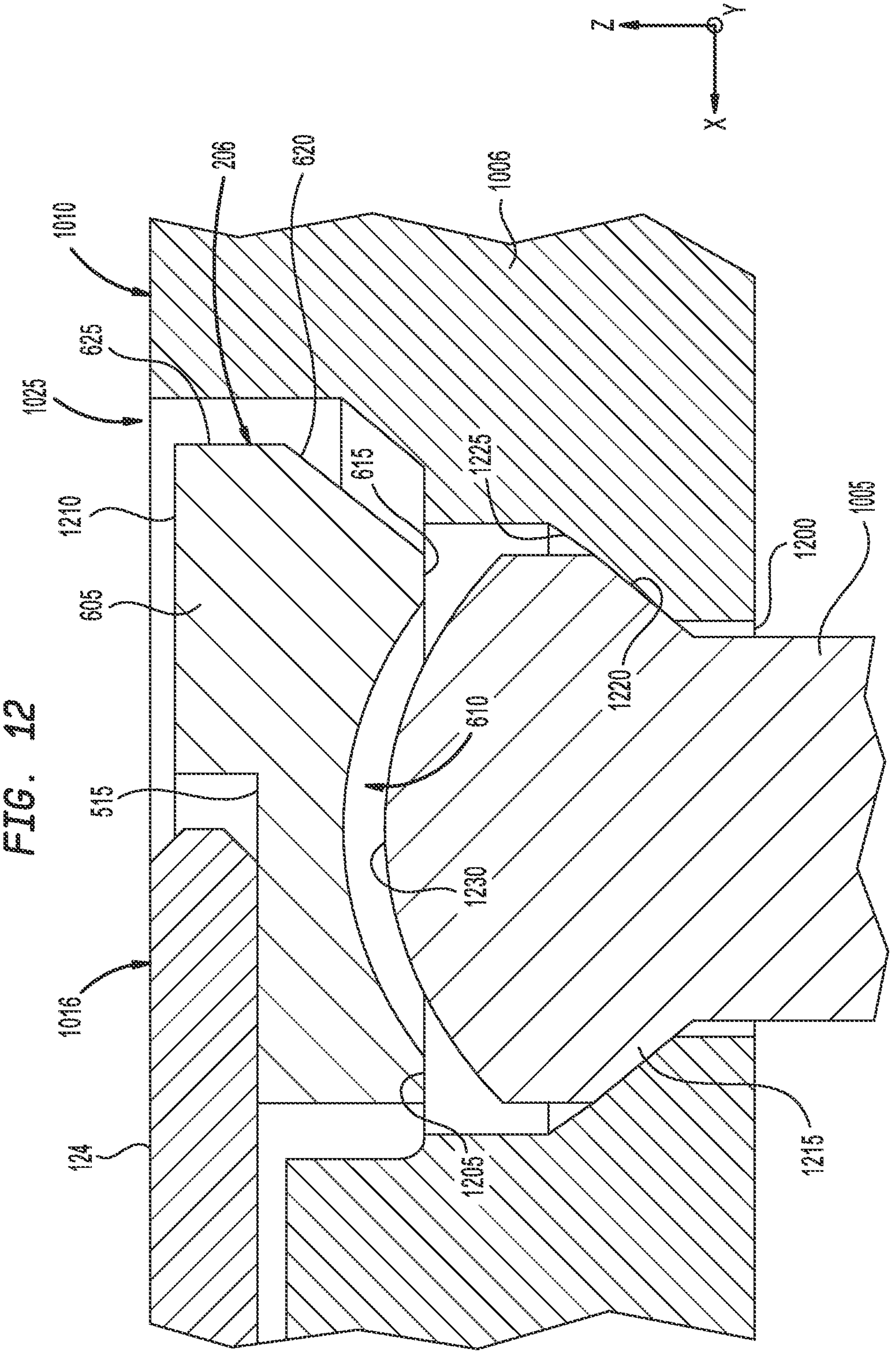
FIG. 12 is an enlarged sectional view of a portion of the susceptor and the carrier of FIG. 10.

FIG. 12 is an enlarged sectional view of a portion of the susceptor 1006 and the carrier 206 of FIG. 10. As described in FIG. 10, the carrier 206 is disposed in a groove 1025 formed in the front side 1010 of the susceptor 1006. One of the carrier lift pins 1005 is provided through an opening 1200 formed in the susceptor 1006 adjacent to the groove 1025. In the processing position as shown in FIGS. 10 and 12, the carrier lift pin 1005 disengages the carrier 206 such that the carrier 206 rests or is received in the groove 1025. For example, the groove 1025 includes a reference surface 1205 where the peripheral edges 615 of the carrier 206 may be supported. In the processing position as shown, the groove 1025 and the carrier 206 are constructed such that an upper surface 1210 of the carrier 206 is below a plane of one or both of the front side 1010 of the susceptor 1006 and a plane of an upper surface of the substrate 124. The carrier lift pin 1005 includes a flared head 1215 that allows the carrier lift pin 1005 to be suspended within the susceptor 1006 as well as being spaced away from the carrier 206. For example, the carrier lift pin 1005 includes a circular angled sidewall 1220 that fits with an angled side 1225 of the opening 1200.

However, during transfer, the carrier 206 having the substrate 124 thereon may be lifted away from the susceptor 1006. For example, the susceptor 1006 may be urged downward (in the Z direction) such that a convex portion 1230 of the flared head 1215 contacts the concave groove 610 of the carrier 206. Continued lifting of the lift pin 1005 in the Z direction spaces the substrate 124 away from the front side 1010 of the susceptor 1006 as shown in FIG. 11. Spacing the substrate 124 and the carrier 206 away from the susceptor 1006 allows a robot blade (not shown, for example the blade 134 of the vacuum robot 130 shown in FIG. 1) to enter therebetween.

While the foregoing is directed to embodiments of the present disclosure, other and further embodiments of the disclosure may be devised without departing from the basic scope thereof, and the scope thereof is determined by the claims that follow.

The invention claimed is:

1. A chamber, comprising:
- a platen having a heat transfer element embedded therein;
- a plurality of carrier holders positioned about the platen;
- a plurality of support members extending from the plurality of carrier holders;
- a carrier positioned on the support members of one of the plurality of carrier holders; and
- a lift pin assembly, comprising:
  - a support plate,
  - a base housing coupled to the support plate,
  - a shaft made of a first material and comprising a depression formed in the shaft, the shaft at least partially disposed in the base housing,
  - a tip made of a second material and comprising a protruded portion fitted into the depression using an interference fit, wherein the second material is softer than the first material,
  - a gripping member disposed in the base housing, wherein an end of the shaft is coupled to the gripping member, and
  - a retainer housing disposed in the base housing and coupled to the support plate, wherein a lip of the gripping member is received in the retainer housing.

2. The chamber of claim 1, wherein each of the plurality of carrier holders includes a plurality of support members extending therefrom to support the carrier.

3. The chamber of claim 1, wherein the lift pin assembly comprises a plurality of lift pins movably disposed through the platen.

4. The chamber of claim 3, wherein each of the plurality of lift pins comprises the tip and the shaft.

5. The chamber of claim 4, wherein the second material of the tip is a polymer material and the first material of the shaft is a metallic material.

6. The chamber of claim 3, wherein each of the plurality of lift pins is operably coupled to a dedicated actuator.

7. The chamber of claim 3, wherein the plurality of lift pins are disposed in openings formed in the platen, and each of the openings is fluidly coupled to a vacuum system.

8. The chamber of claim 3, wherein the plurality of lift pins are disposed inwardly of the carrier and the plurality of carrier holders.

9. The chamber of claim 1, wherein each of the plurality of carrier holders comprises a standoff and a curved lip.

10. The chamber of claim 1, wherein each of the plurality of carrier holders is mounted to a support that is coupled to a shaft extending through a bottom of the chamber.

11. A lift pin assembly, comprising:
- a support plate;
- a base housing coupled to the support plate;
- a shaft made of a first material and comprising a depression formed in the shaft, the shaft at least partially disposed in the base housing;
- a tip made of a second material and comprising a protruded portion fitted into the depression using an interference fit, wherein the second material is softer than the first material;
- a gripping member disposed in the base housing, wherein an end of the shaft is coupled to the gripping member; and
- a retainer housing disposed in the base housing and coupled to the support plate, wherein a lip of the gripping member is received in the retainer housing.

12. The lift pin assembly of claim 11, wherein the first material is a metallic material and the second material is a polymer material.

13. The lift pin assembly of claim 11, further comprising a bellows disposed about at least part of the shaft.

14. A method of transferring a substrate to a chamber, comprising:
- positioning the substrate above a carrier positioned on one of a plurality of carrier holders positioned about a platen;
- positioning the substrate on a plurality of lift pins of a lift pin assembly, the lift pin assembly comprising:
  - a support plate,
  - a base housing coupled to the support plate,
  - a shaft made of a first material and comprising a depression formed in the shaft, the shaft at least partially disposed in the base housing,
  - a tip made of a second material and comprising a protruded portion fitted into the depression using an interference fit, wherein the second material is softer than the first material,
  - a gripping member disposed in the base housing, wherein an end of the shaft is coupled to the gripping member, and
  - a retainer housing disposed in the base housing and coupled to the support plate, wherein a lip of the gripping member is received in the retainer housing; and
- positioning the substrate on the carrier.

15. The method of claim 14, wherein the positioning of the substrate above the carrier comprises extending a first robot blade into the chamber.

16. The method of claim 15, wherein the positioning of the substrate on the plurality of lift pins comprises lowering the first robot blade to contact the substrate with the plurality of lift pins, wherein each of the plurality of lift pins comprises the tip and the shaft.

17. The method of claim 16, wherein the positioning of the substrate on the carrier comprises:

raising the plurality of carrier holders to contact the substrate with the carrier.

18. The method of claim 17, further comprising:

retracting the plurality of lift pins away from the substrate;

extending a second robot blade into the chamber; and lowering the plurality of carrier holders to contact the carrier with the second robot blade and position the carrier and the substrate on the second robot blade.

19. The chamber of claim 1, further comprising:

a seal disposed at an interface between the base housing and the support plate;

a base pin coupled to the retainer housing and the support plate;

a bushing disposed about the shaft;

a motor coupled to the support plate via a flexible joint member, the motor coupled between the support plate and the platen.

20. The chamber of claim 19, wherein the lift pin assembly further comprises:

a bellows disposed between the platen and the base housing, the bellows made of a metallic alloy; and a mounting plate coupled between the platen and the bellows, the mounting plate coupled to the platen via fasteners.

21. The chamber of claim 19, wherein:

the base pin and the base housing are made of one or more metals;

the bushing is made of a plastic material and is secured by an internal retainer;

a limit member is coupled to the support plate; and the flexible joint member comprises:

a base coupled to the support plate by a plurality of base fasteners, each of the base fasteners passing through oversize holes formed in the support plate, each of the oversize holes having a diameter greater than a diameter of the base fasteners, the base comprising a through-slot that receives a portion of a central fastener, and the central fastener coupling the motor to the base.

22. The chamber of claim 21, wherein the through-slot exposes at least a portion of a head of the central fastener, rotation of the central fastener moves the central fastener, and the flexible joint member provides a gap between the support plate and a peripheral region of the base when the flexible joint member is actuated.

23. The lift pin assembly of claim 12, wherein:

the polymer material comprises one or more fluoropolymers;

the gripping member comprises a polyimide-based polymer; and the retainer housing comprises a metal.

24. The chamber of claim 7, wherein the vacuum system comprises:

a plurality of primary vacuum tubes associated with the openings and coupled to a fore line by one or more secondary vacuum tubes, each of the primary vacuum tubes fluidly coupled to one of the openings by a bore formed in the platen, wherein the openings are formed between two major surfaces of the platen, and the bore is formed between the respective one of the openings and one of the two major surfaces.

* * * * *